(12) United States Patent
Perreault et al.

(10) Patent No.: US 7,242,269 B2
(45) Date of Patent: *Jul. 10, 2007

(54) FILTER HAVING PARASITIC INDUCTANCE CANCELLATION

(75) Inventors: David J. Perreault, Brookline, MA (US); Timothy C. Neugebauer, Cambridge, MA (US); Joshua W. Phinney, Glen Oaks, NY (US)

(73) Assignee: Massachusetts Institute of Technology, Cambridge, MA (US)

( * ) Notice: Subject to any disclaimer, the term of this patent is extended or adjusted under 35 U.S.C. 154(b) by 24 days.

This patent is subject to a terminal disclaimer.

(21) Appl. No.: 11/119,659

(22) Filed: May 2, 2005

(65) Prior Publication Data

US 2006/0077018 A1    Apr. 13, 2006

Related U.S. Application Data

(63) Continuation-in-part of application No. 10/082,616, filed on Feb. 25, 2002, now Pat. No. 6,937,115.

(51) Int. Cl.
*H03H 7/01* (2006.01)
*H03H 7/00* (2006.01)

(52) U.S. Cl. ...................... 333/177; 333/172
(58) Field of Classification Search ............... 333/172, 333/175, 177, 181, 185; 361/270
See application file for complete search history.

(56) References Cited

U.S. PATENT DOCUMENTS

| 1,920,948 | A | 8/1933 | Crouse |
|---|---|---|---|
| 3,465,267 | A | 9/1969 | Carlson, Jr. |
| 4,422,059 | A | 12/1983 | Fuji et al. |
| 4,451,804 | A | 5/1984 | Veisz et al. |
| 4,577,145 | A | 3/1986 | Mullersman |
| 5,038,263 | A | 8/1991 | Marrero et al. |
| 5,148,804 | A | 9/1992 | Hill et al. |
| 5,495,405 | A | 2/1996 | Fujimura et al. |
| 5,694,297 | A | 12/1997 | Smith et al. |
| 5,761,049 | A | 6/1998 | Yoshidome et al. |
| 6,239,557 | B1 | 5/2001 | Chang et al. |
| 6,476,689 | B1 | 11/2002 | Uchida et al. |
| 6,529,363 | B2 | 3/2003 | Waffenschmidt et al. |

FOREIGN PATENT DOCUMENTS

| JP | 06224045 8 A | 12/1994 |
|---|---|---|
| JP | 2001160728 A | 12/2001 |

OTHER PUBLICATIONS

T.K. Phelps and W.S. Tate, Optimizing Passive Input Filter Design, Process of the 6th National Solid Slate Power Conversion Conference Poweroon 6), May 1979, pp. G1-1—G1-10.

(Continued)

*Primary Examiner*—Dean Takaoka
(74) *Attorney, Agent, or Firm*—Daly, Crowley, Mofford & Durkee, LLP

(57) ABSTRACT

An electrical component includes a capacitive impedance and a shunt path inductance cancellation feature provided by coupled windings. A filter having a capacitor with capacitor-path inductance cancellation provides enhanced performance over frequency compared with conventional capacitors.

20 Claims, 26 Drawing Sheets

OTHER PUBLICATIONS

David C. Hamill, Philip T. Krain, A Zero Ripple Technique Applicable To Any DC Converter, , 1999 IEEE Power Electronics Specialists Conference, pp. 1165-1171.

Johann W. Kolar, Hari Sree, Ned Mohan, Franz C. Zach, Novel Aspects of an Application of 'Zero'-Ripple Techniques to Basic Converter Topologies, 1997 IEEE Power Electronics Specialists Conference, pp. 796-803.

Sam Y. M. Feng, William A. Sander, III and Thomas G. Wilson, Small-Capacitance Nondissipative Ripple Filters for DC Supplies, IEEE Transactions on Magnetics, Mar. 1970, pp. 137-142.

Steven Senini, Peter J. Wolfs, The Coupled Inductor Filter: Analysis and Design for AC Systems, IEEE Transactions on Idustrial Electronics, vol. 45, No. 4, Aug. 1998, pp. 574-578.

Slobodan CUK, A New Sero-Ripple Switching DC-to-DC Converter and Integrated Magnetics, IEEE Transactions on Magnetics on Magnetics, vol. MAG-19, No. 2, Mar. 1983, pp. 57-75.

D.L. Logue and P.T. Krein, Optimization of Power Electronio Systems Using Ripple Correlation Control: A Dynamioc Programming Approach, 2001 IEEE Power Electronics Specialists Conference, pp. 459-464.

Robert A. Heartz, Herbert Buelteman, Jr., The Application of Perpendicularly Superposed Magnetic Fields, AIEE Trans. Pt. 1, Nov. 1955, vol. 74, pp. 655-660.

H. J. McCreary, The Magnetic Cross Valve, AIEE Transactions, vol. 70, Pt. II, pp. 1868-1875.

Joshua W. Phinney, Fillers with Active Tuning for Power Applications, May 30, 2002, pp. 1-133.

Powering the Future: New Opportunitiee in Power Electronics, MIT Laboratory for Electromagnetic and Electronic Systems, Apr. 10, 2001, pp. 1-42.

PCT International Search Report PCT/US 02/37961, dated Nov. 27, 2002.

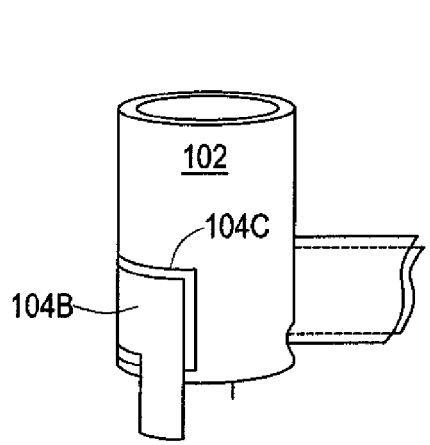 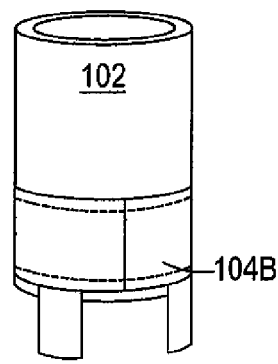 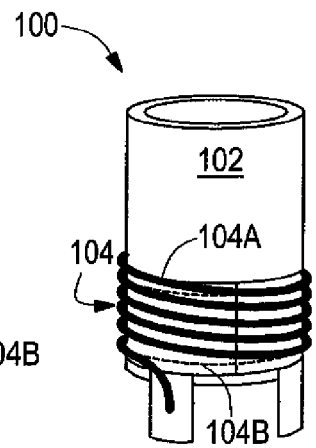
*FIG. 4C*  *FIG. 4B*  *FIG. 4A*
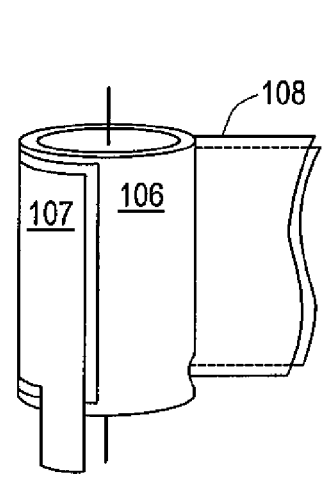 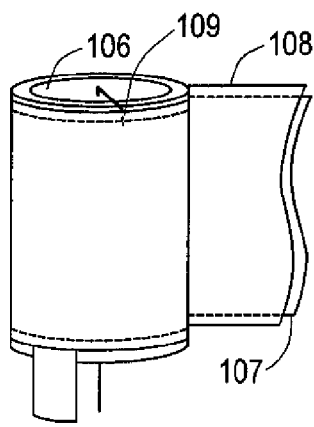 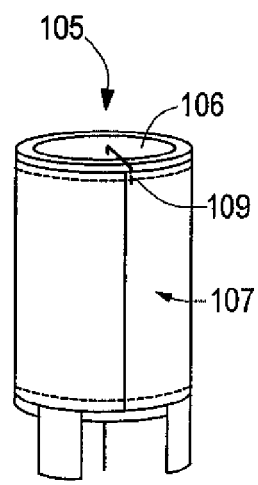
*FIG. 4F*  *FIG. 4E*  *FIG. 4D*

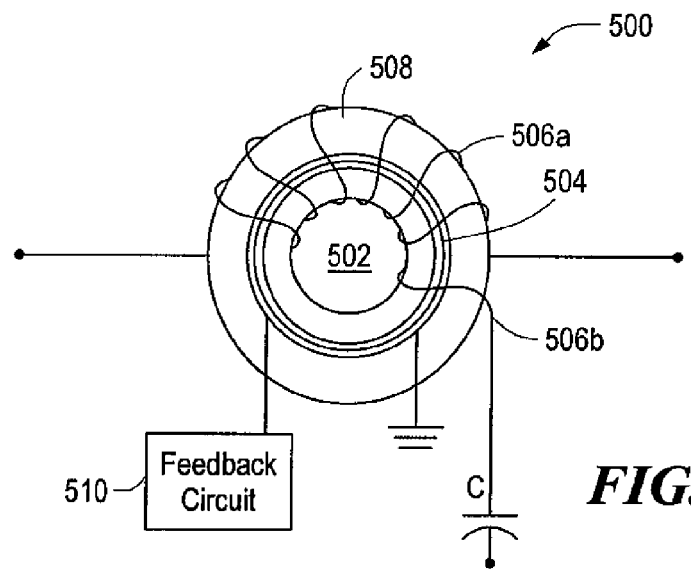
FIG. 13A
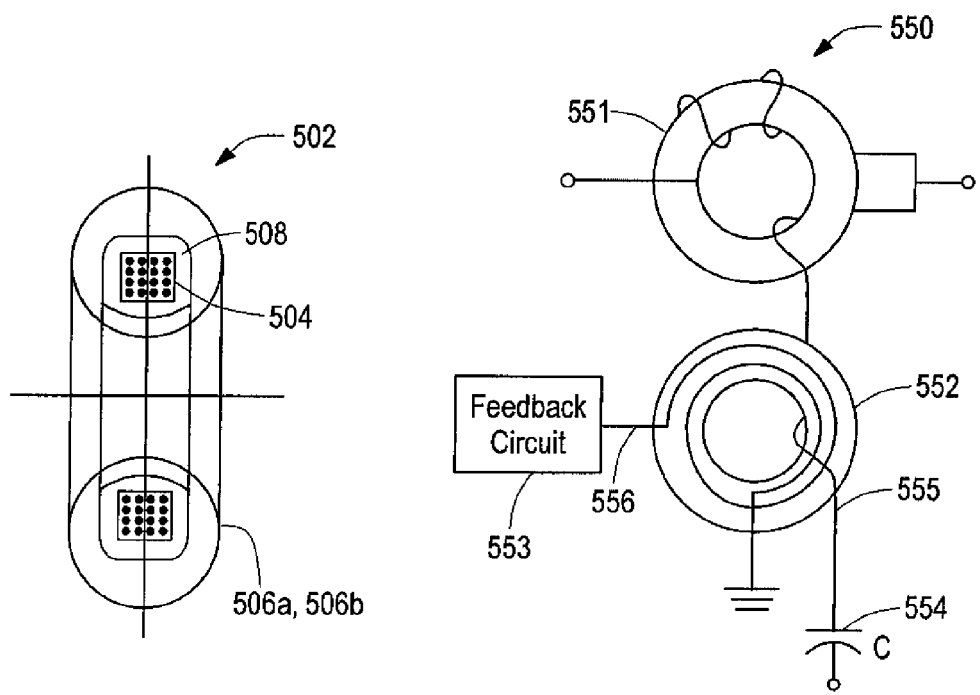
FIG. 13B
FIG. 13C

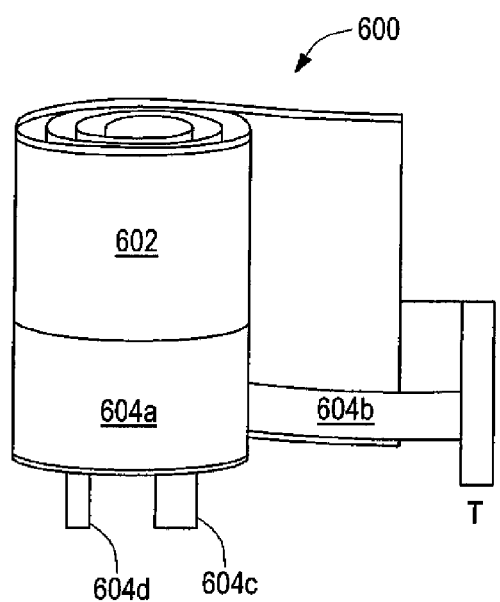
*FIG. 14*
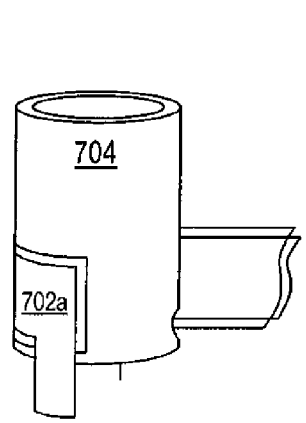 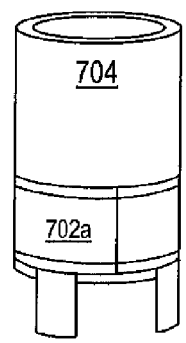 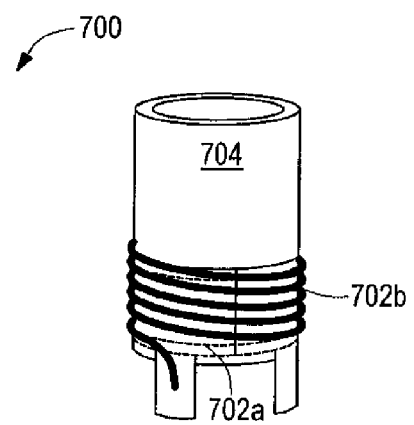
*FIG. 15A*    *FIG. 15B*    *FIG. 15C*

FILTER HAVING PARASITIC INDUCTANCE CANCELLATION

CROSS REFERENCE TO RELATED APPLICATIONS

The present application is a continuation-in-part of U.S. patent application Ser. No. 10/082,616, filed on Feb. 25, 2002 now U.S. Pat. No. 6,937,115, which is incorporated herein by reference.

STATEMENT REGARDING FEDERALLY SPONSORED RESEARCH

The Government may have certain rights in the invention pursuant to Contract No. N000140010381 sponsored by the U.S. Office of Naval Research.

FIELD OF THE INVENTION

The present invention relates generally to electrical components and filters and, more particularly, to components and filters for suppressing electrical signals.

BACKGROUND OF THE INVENTION

As is well known in the art, electrical and electronic applications can utilize electrical filters to suppress undesirable signals, such as electrical noise and ripple. Such filters are designed to prevent the propagation of unwanted frequency components from the filter input port to the filter output port, while passing desirable components. Low-pass filters, which pass relatively low frequency signals, typically employ capacitors as shunt elements, and may include inductors or other components as series elements. Illustrative prior art filter arrangements are shown in FIGS. 1A-C.

The attenuation of a filter stage can be determined by the amount of impedance mismatch between the series and shunt paths. For a low-pass filter, it is generally desirable to minimize shunt-path impedance and maximize series-path impedance at high frequencies.

However, the performance of such filters can be degraded by the filter capacitor parasitics. Parasitic effects refer to effects that cause the component to deviate from its ideal or desired characteristic. FIG. 2 shows a prior art first order model for a conventional filter capacitor $C_F$ including the equivalent series resistance (ESR), $R_{ESR}$ and equivalent series inductance (ESL), $L_{ESL}$, of the capacitor. FIG. 3 illustrates the impedance characteristic of a typical prior art capacitor across frequency. As can be seen, at higher frequencies the capacitor impedance is dominated by the ESL. For example, a typical aluminum electrolytic capacitor may appear inductive (impedance rising with frequency) at frequencies above 50-100 kHz, thereby limiting its ability to shunt ripple at high frequencies.

One prior-art approach for overcoming filter capacitor limitations is to couple capacitors of different types in parallel (to cover different frequency ranges) and/or to increase the order of the filter used (e.g., by adding series filter elements such as inductors). While these approaches can reduce parasitic effects to some extent, they can add considerable size, complexity, and cost to the filter.

It would, therefore, be desirable to provide a component and filter that overcome the aforesaid and other disadvantages.

SUMMARY OF THE INVENTION

The present invention provides an electrical component that cancels the effect of the series inductance of a capacitive element or other element or circuit. With this arrangement, a low-pass filter including an electrical component in the shunt path with inductance cancellation provides enhanced performance over frequency by maintaining a relatively low shunt path impedance out to relatively high frequencies.

While the invention is primarily shown and described in conjunction with electrical filters, it is understood that the invention is applicable to a wide variety of circuits, including power converters, transient suppressors, and sensors, e.g., resistive current sensors, in which it is desirable to cancel the inductance of a component or circuit. In addition, while the shunt path impedance is typically the focus for common low-pass filters, in a high-pass filter, the series-path (of the filter) impedance may be considered to a greater extent. It is further understood that parasitic inductance, as used herein, is not limited to a particular component or element since the parasitic inductance of other parts of the circuit (e.g., wiring) may also be addressed with the inventive inductance cancellation technique.

In one aspect of the invention, a component includes a capacitor connected to coupled windings for nullifying series inductance associated with the capacitor. The coupled windings provide an inductive impedance that cancels an inductive impedance of the capacitor, which can be referred to as an equivalent series inductance of the capacitor.

In another aspect of the invention, a filter includes a component having a capacitive element and capacitive-path inductance cancellation provided by coupled windings. The coupled windings cancel the equivalent series inductance of the capacitor so as to enhance the filter performance over frequency.

In further aspect of the invention, a method of fabricating an electrical filter component includes patterning a conductor to create discrete magnetically-coupled windings, and electrically coupling the discrete magnetically-coupled windings to a capacitor having first and second terminals such that magnetic induction of the magnetically-coupled windings provides capacitor-path inductance cancellation. The induction of the windings generates a voltage that counteracts a voltage due to equivalent series inductance of the capacitor and does not counteract a voltage due to the capacitance of the capacitor.

BRIEF DESCRIPTION OF THE DRAWINGS

The invention will be more fully understood from the following detailed description taken in conjunction with the accompanying drawings, in which:

FIGS. 4A-C provide a schematic representation of an electrical component having capacitor-path inductance cancellation in accordance with the present invention;

FIGS. 4D-F provide a further schematic representation of an electrical component having capacitor-path inductance cancellation in accordance with the present invention;

FIG. 13A is schematic depiction of a component having inductance cancellation in accordance with the present invention and an adaptive inductance cancellation circuit;

FIG. 13B is a cross-sectional schematic depiction of a cross-field reactor that can form a part of a component having inductance cancellation in accordance with the present invention;

FIG. 13C is a schematic depiction of a component having inductance cancellation and an adaptive inductance cancellation circuit in accordance with the present invention;

FIG. 14 is a pictorial representation of an integrated component having inductance cancellation in accordance with the present invention;

FIGS. 15A-C show an integrated filter element having inductance cancellation in accordance with the present invention;

DETAILED DESCRIPTION OF THE INVENTION

Figure 1A:
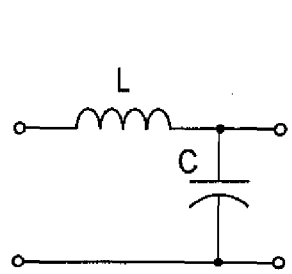
FIG. 1A is a schematic representation of a prior art filter circuit.
Figure 1B:
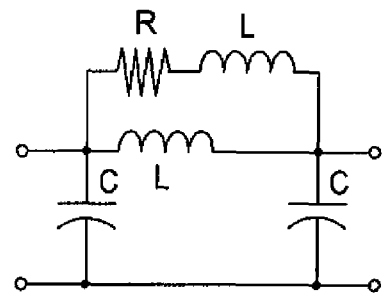
FIG. 1B is a schematic representation of another prior art filter circuit.
Figure 1C:
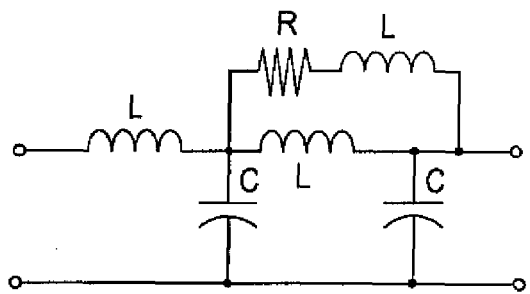
FIG. 1C is a schematic representation of a further prior art filter circuit.
Figure 2:
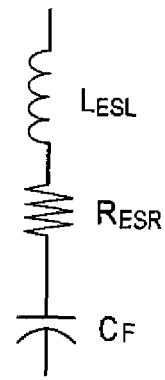
FIG. 2 is a schematic representation of a prior art first order model for a filter capacitor.
Figure 3:
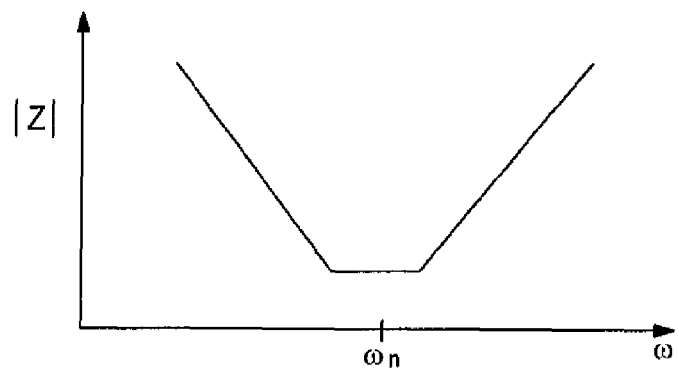
FIG. 3 is a graphical depiction of impedance magnitude versus frequency for a prior art capacitor.

FIG. 4A shows an electrical component 100 having a capacitor 102 and coupled magnetic windings 104A,B to cancel the equivalent series inductance of the capacitor and also to provide series filter impedance in the other filter branch. In the relatively simple illustrative embodiment of FIG. 4A, a first winding 104B, which can be provided as foil, is wound about the capacitor 102 (FIGS. 4C and 4B). A second winding 104A, which can be provided as a wire winding, is placed over the first winding 104B such that the windings are coupled. In general, the coupled magnetic windings 104 effectively nullify the inductance of the capacitor 102 and can provide series filter impedance in the other filter path, as described in detail below. It is understood that inductance cancellation refers to cancellation of an inductive characteristic component of capacitors or other components.

FIG. 4D shows an electrical component 105 having a capacitor 106 and coupled magnetic windings 107 to cancel the equivalent series inductance in the electrical path of the capacitor, and also to provide series impedance in the other electrical path. In the relatively simple illustrative embodiment of FIG. 4D, the magnetic windings are formed from a single conductor and insulating layer wound about the capacitor 106 (FIGS. 4F and 4E) with the conductor tapped at an appropriate point 109. In general, the coupled magnetic windings 107 formed from the wound and tapped conductor effectively cancel the inductance in the electrical path of the capacitor 106, and can provide inductive impedance in another electrical path, as described in detail below.

Figure 5:
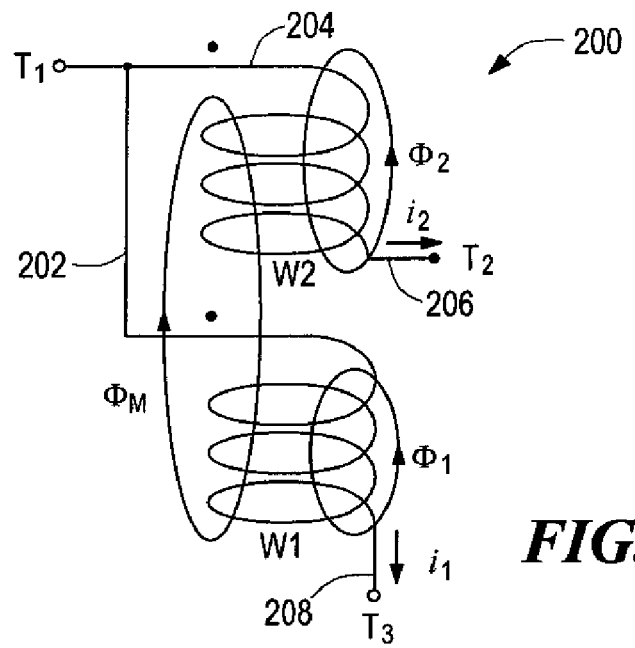
FIG. 5 is a schematic representation of an exemplary coupled magnetic winding circuit that can form a part of a filter element having inductance cancellation in accordance with the present invention.

FIG. 5 shows one exemplary embodiment of a coupled magnetic winding circuit 200, which can correspond to the coupled magnetic windings 104 of FIG. 4A. The circuit 200 includes inductively coupled first and second windings W1, W2. A first terminal T1 is coupled to a first end 202 of the first winding WI and to a first end 204 of the second winding W2. A second terminal T2 is coupled to the second end 206 of the second winding W2 and a third terminal T3 is coupled to the second end 208 of the first winding W1. Current flow is indicated by arrows $i_1$, $i_2$.

The first winding W1 generates a first flux $\Phi_1$ and the second winding W2 generates a second flux $\Phi_2$. The first and second windings W1, W2 are magnetically coupled, and together produce a mutual flux $\Phi_M$.

Figure 6:
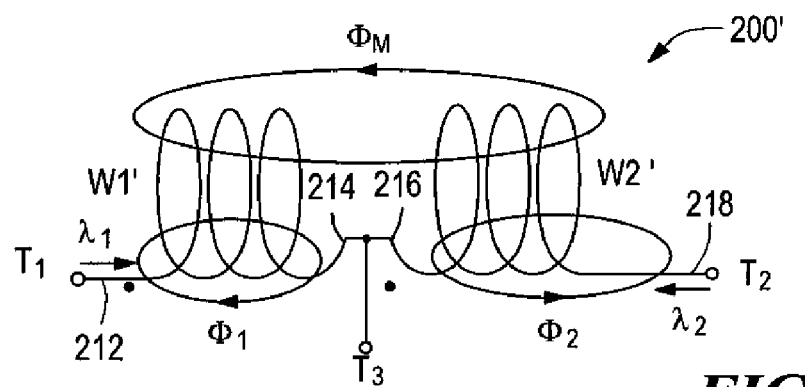
FIG. 6 is a schematic representation of another exemplary coupled magnetic winding circuit that can form a part of a filter element having inductance cancellation in accordance with the present invention.

FIG. 6 shows an alternative exemplary embodiment of a three-terminal coupled magnetic winding circuit 200' that can correspond to the coupled magnetic windings 107 of FIG. 4D. The circuit 200' includes magnetically-coupled first and second windings W1' and W2', which may optionally be formed from a single winding tapped at an appropriate point. A first terminal T1 is coupled to a first end 212 of the first winding W1'. A second terminal T2 is coupled to a second end 218 of the second winding W2'. A third terminal T3 is coupled to a second end 214 of the first winding W1' and a first end 216 of the second winding W2'.

The first winding W1' generates a first flux $\Phi_1$ and the second winding W2' generates a second flux $\Phi_2$. The first and second windings W1', W2' are magnetically coupled, and together produce a mutual flux $\Phi_M$.

The system of FIG. 5 can be described using an inductance matrix as set forth below in equation 1:

$$\begin{bmatrix} \lambda_1 \\ \lambda_2 \end{bmatrix} = \begin{bmatrix} \frac{N_1^2}{\mathcal{R}_{11}} + \frac{N_1^2}{\mathcal{R}_M} & \frac{N_1 N_2}{\mathcal{R}_M} \\ \frac{N_1 N_2}{\mathcal{R}_M} & \frac{N_2^2}{\mathcal{R}_{22}} + \frac{N_2^2}{\mathcal{R}_M} \end{bmatrix} \begin{bmatrix} i_1 \\ i_2 \end{bmatrix} = \begin{bmatrix} L_{11} & L_M \\ L_M & L_{22} \end{bmatrix} \begin{bmatrix} i_1 \\ i_2 \end{bmatrix} \qquad \text{Eq. 1}$$

where the flux linkages $\lambda_1$ and $\lambda_2$ are the integrals of the individual coil voltages, $i_1$ and $i_2$ are the individual coil currents, $N_1$ and $N_2$ represent the number of turns on the respective coils W1, W2, and $\mathcal{R}_1$, $\mathcal{R}_2$, and $\mathcal{R}_M$ represent the reluctances of the respective magnetic flux paths. The self inductances $L_{11}$ and $L_{22}$ and mutual inductance $L_M$ are functions of the numbers of coil turns $N_1$, $N_2$ and the reluctances $\mathcal{R}_{11}$, $\mathcal{R}_{22}$, $\mathcal{R}_M$ of the magnetic flux paths. It is understood that where no magnetic material is present, the behavior of the coupled windings is determined principally by the geometry of the windings.

Figure 7:
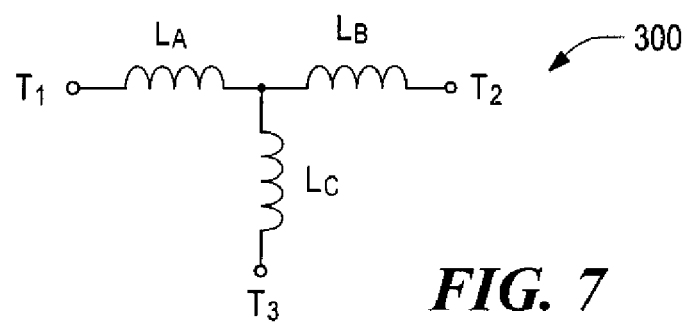
FIG. 7 is a circuit diagram of an exemplary equivalent circuit model for the circuit of FIG. 5.

FIG. 7 shows an equivalent circuit model 300 for the coupled magnetic winding circuit 200 of FIG. 5 and circuit 200' of FIG. 6. The circuit model 300 can be referred to as a "T-circuit." As is well understood by one of ordinary skill in the art, the circuit model 300 represents a circuit analysis tool and is not intended to provide a physical model of the actual circuit. The circuit model 300 includes three inductors $L_A$, $L_B$, and $L_C$. In representing the coupled magnetic winding circuit 200 of FIG. 5, inductance $L_A$ equals a mutual inductance $L_M$, which represents a mutual inductance of first and second windings W1, W2; the inductance of the inductor $L_C$ corresponds to the self inductance $L_{11}$ of the first winding W1 minus the mutual inductance $L_M$, i.e., $L_{11}-L_M$; and the inductance of the inductor $L_B$ corresponds to the self inductance $L_{22}$ of the second winding W2 minus the mutual inductance $L_M$, i.e., $L_{22}-L_M$.

Referring again to the system of FIG. 5, conservation of energy considerations require that the mutual inductance of the windings be less than or equal to the geometric mean of the self inductances, which can be expressed as set forth in Equation 2 below:

$$L_M \leq \sqrt{L_{11} L_2} \qquad \text{Eq. 2}$$

Thus, the inductance matrix of Equation 1 is necessarily positive semidefinite. Note that while the constraint of Equation 2 limits the mutual inductance $L_M$ to be less than or equal to the geometric mean of the self inductances $L_{11}$, $L_{22}$, it may still be larger than one of the two inductances. For example; with proper winding of the coils the inductance relationships can be defined in Equation 3:

$$L_{11} < L_M < \sqrt{L_{11} L_{22}} < L_{22} \qquad \text{Eq. 3}$$

Figure 8:
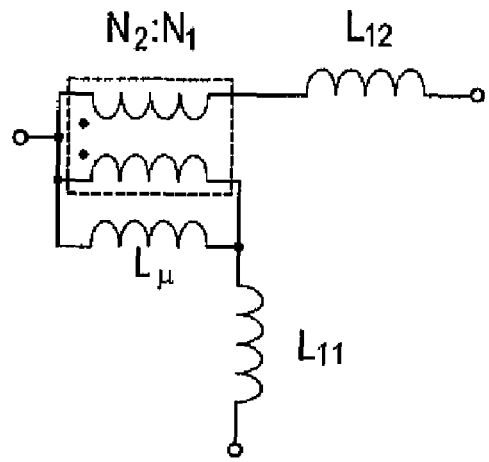
FIG. 8 is a circuit diagram of an exemplary physically-based circuit model for coupled magnetic windings that can form a part of a electrical component having inductance cancellation in accordance with the present invention.

Referring again to FIG. 7, which is the "T" model of the coupled windings, it can be seen that with the ordering of self and mutual inductances of Equation 3, the inductance of the inductor $L_C$ in the T model, i.e., the vertical leg, is negative, since it equals $L_{11}-L_M$. It is this "negative inductance" that overcomes the high-frequency limitations of conventional filter capacitors. The negative-inductance effect arises from electromagnetic induction between the two coils, as suggested by the physically-based circuit model of the coupled windings shown in FIG. 8. It will be readily appreciated by one of ordinary skill in the art that the negative inductance in the T model does not violate any physical laws. The total inductance seen across the terminals T1 and T3 in FIG. 7 is the positive-valued self inductance of the winding WI in FIG. 5 ($L_A+L_C=L_M+L_{11}-L_M=L_{11}$).

Figure 9:
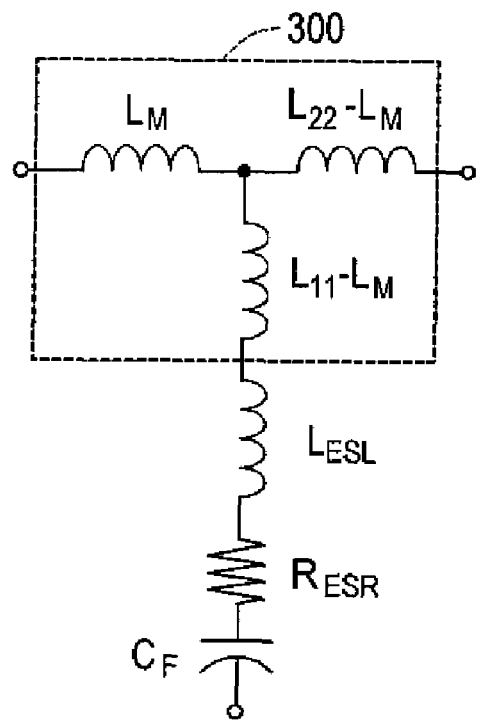
FIG. 9 is a circuit diagram of the circuit model of FIG. 7 applied to a capacitor.

FIG. 9 shows the application of the coupled magnetic windings of FIG. 5 to a capacitor $C_F$ whose equivalent series inductance $L_{ESL}$ is to be cancelled or nullified. The coupled windings are modeled with the T network 300 of FIG. 7, while the capacitor $C_F$ is shown as an ideal capacitor in series with parasitic resistance $R_{ESR}$ and parasitic inductance $L_{ESL}$. It is understood that any interconnect parasitics can be lumped into these elements. When $L_{11}-L_M$ is chosen to be negative and close in magnitude to $L_{ESL}$, a net capacitive branch inductance $\Delta L = L_{11}-L_M+L_{ESL} \approx 0$ results.

The combined network is advantageous as a filter since a near-zero capacitor-path impedance (limited only by ESR) is maintained out to significantly higher frequencies than is possible with the capacitor alone. Furthermore, when $L_{22}$ is much greater than $L_M$, the inductance $L_{22}-L_M$ appearing in the other branch serves to increase the order of the filter network, further improving filter performance.

It will be appreciated that other magnetic winding structures can also be used to realize inductance cancellation. Referring again to FIG. 6, another exemplary embodiment of a three-terminal coupled magnetic winding circuit 200' is shown that can be used for inductance cancellation. This embodiment is advantageous in that it can be formed from a single winding tapped at an appropriate point, as suggested by FIGS. 4D-F.

The system of FIG. 6 can be described using an inductance matrix as set forth below in equation 4:

$$\begin{bmatrix} \lambda_1 \\ \lambda_2 \end{bmatrix} = \begin{bmatrix} \frac{N_1^2}{\mathfrak{R}_{11}} + \frac{N_1^2}{\mathfrak{R}_M} & -\frac{N_1 N_2}{\mathfrak{R}_M} \\ -\frac{N_1 N_2}{\mathfrak{R}_M} & \frac{N_2^2}{\mathfrak{R}_{22}} + \frac{N_2^2}{\mathfrak{R}_M} \end{bmatrix} \begin{bmatrix} i_1 \\ i_2 \end{bmatrix} = \begin{bmatrix} L_{11} & -L_M \\ -L_M & L_{22} \end{bmatrix} \begin{bmatrix} i_1 \\ i_2 \end{bmatrix} \quad \text{Eq. 4}$$

where the flux linkages $\lambda_1$ and $\lambda_2$ are the integrals of the individual coil voltages, $i_1$ and $i_2$ are the individual coil currents, $N_1$ and $N_2$ represent the number of turns on the respective coils W1', W2', and $\mathfrak{R}_{11}$, $\mathfrak{R}_{22}$, and $\mathfrak{R}_M$ represent the reluctances of the respective magnetic flux paths. The self inductances $L_{11}$ and $L_{22}$ and mutual inductance $L_M$ are functions of the numbers of coil turns $N_1$, $N_2$ and the reluctances $\mathfrak{R}_{11}$, $\mathfrak{R}_{22}$, $\mathfrak{R}_M$ of the magnetic flux paths. The magnitude of the mutual inductance is again limited by the constraint of equation 2.

The system of FIG. 6 can also be modeled with the "T model" of FIG. 7: in this case, $L_A = L_{11} + L_M$, $L_B = L_{22} + L_M$, and $L_C = -L_M$. Again, one branch of the T model has a negative inductance (in this case equal in magnitude to the mutual inductance $L_M$). When $L_M$ is chosen to be close in magnitude to the equivalent series inductance $L_{ESL}$ of an electrical circuit path (e.g., through a capacitor) connected to terminal T3, a reduced net effective inductance $\Delta L = -L_M + L_{ESL} \approx 0$ results in the capacitor path.

As described above, coupled magnetic windings are used to cancel inductance in the capacitor branch path (e.g., due to capacitor and interconnect parasitics) and provide filter inductance in the other branch path. In a low-pass filter, this corresponds to a cancellation of the filter shunt-path inductance, and an addition of series path inductance. It is understood that the inductances to be cancelled can be quite small (e.g., on the order of tens of nanohenries).

Figure 10A:
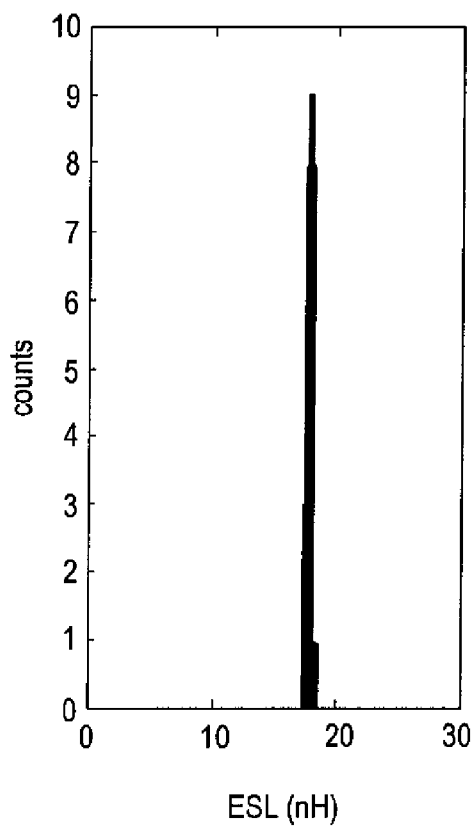
FIG. 10A is a histogram of Equivalent Series Inductance for an exemplary capacitor.
Figure 10B:
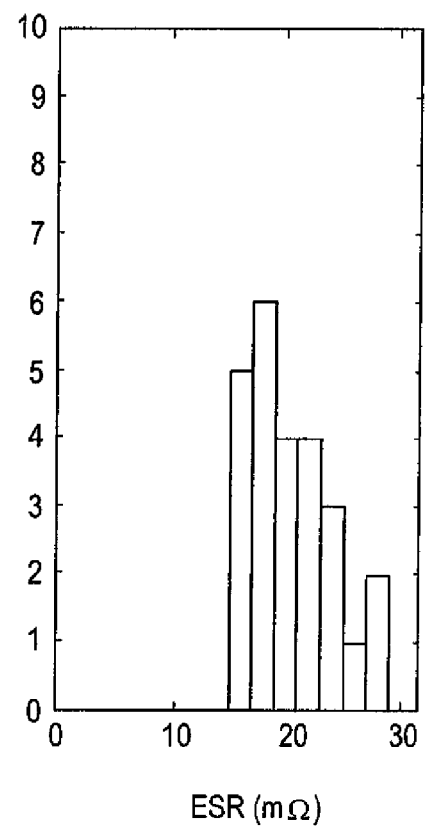
FIG. 10B is a histogram of Equivalent Series Resistance for an exemplary capacitor.

For example, the histograms of FIGS. 10A and 10B show the distribution of ESL and ESR, respectively, for an electrolytic capacitor identified as United Chemi-Con U767D 2200 μF 35 V, which is widely used in filters. As shown in FIG. 10A, the ESL values fall in the range of 17.29 nH to 18.13 nH with a standard deviation of about 44.6 pH. And as shown in FIG. 10B, the ESR ranges from about 14.2 mΩ to about 60.9 mΩ (note that worst-case 60 mΩ outlier not illustrated in FIG. 10B). Coupled magnetic windings appropriate to inductance cancellation in accordance with the present invention should accurately generate a negative effective shunt inductance in this range.

It will be appreciated that, unlike ESR or capacitance value, capacitor ESL is typically highly consistent. For example, in the data of FIG. 10A, the ESL of all units measured is within ±2.4% of the mean, with a standard deviation of only 44.6 pH. The absence of magnetic materials means that the inductance of the structure depends primarily on geometry, while capacitance and resistance depend on material and interface properties. Thus, while appropriate coupled-magnetic structures can be created, the parasitic inductance can be repeatably cancelled to within a few percent of its original value. This can translate into orders of magnitude improvement in filter attenuation performance.

It will be readily apparent to one of ordinary skill in the art that a capacitive component having parasitic inductance cancellation in accordance with the present invention can be achieved in a variety of structures. For example, discrete capacitors and coupled magnetic windings can be used to create high-performance filters and filter stages. In addition, magnetic windings can be incorporated on, in, and/or as part of the capacitor structure itself. An integrated filter element can be provided as a three terminal device providing both capacitance (with very low effective inductance) in one electrical path and inductance in another electrical path.

One approach is to construct filters or filter stages in which discrete coupled windings are used to cancel capacitor and interconnect inductance in the capacitive path of the filter. The discrete coupled windings realize the effective negative shunt inductance accurately and repeatably. Illustrative fabrication techniques include using foil and/or wire windings and using windings printed or metallized on a flexible material. Nonmagnetic formers, which provide "air-core" magnetics, can be used for the relatively small inductances needed and for repeatability and insensitivity to operating conditions. Magnetic materials can be utilized depending upon the requirements of a particular application.

Figure 11A:
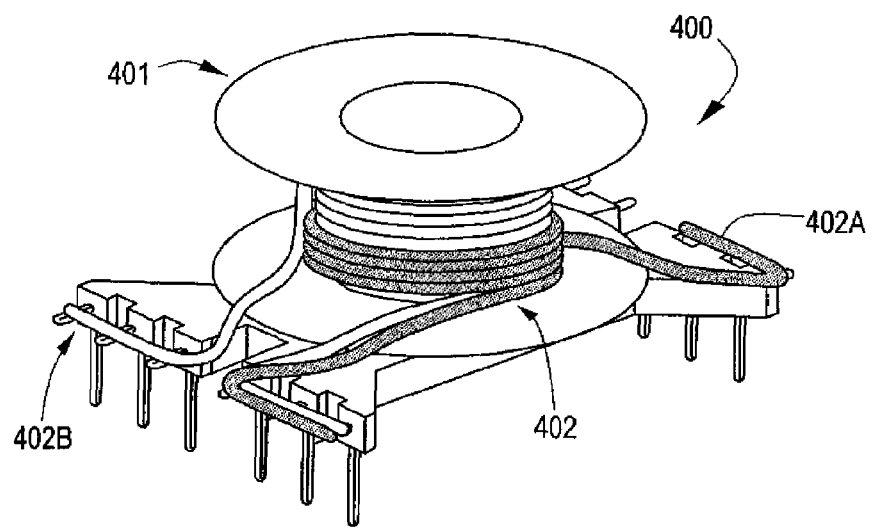
FIG. 11A is a schematic depiction of coupled windings on a former that can form part of a component having inductance cancellation in accordance with the present invention.
Figure 11B:
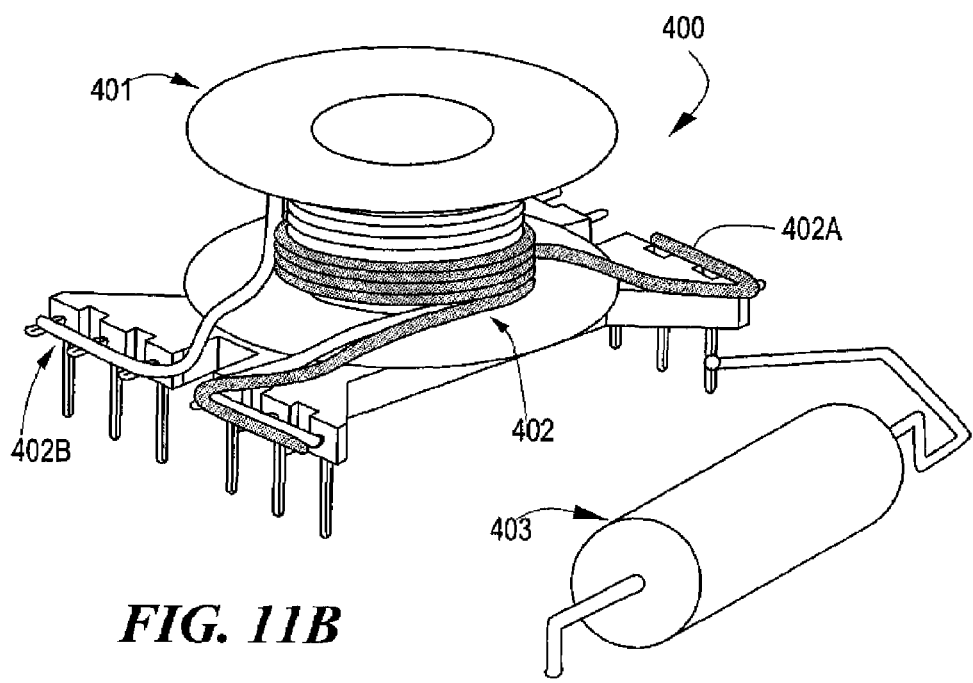
FIG. 11B is a schematic depiction of coupled windings on a former used in conjunction with a capacitor to form a component having capacitor-path inductance cancellation in accordance with the present invention.

FIG. 11a shows exemplary coupled magnetics 400, comprising windings 402A,B wound on a former 401. The former 401 can be mountable on a printed circuit board, for example, though this is not necessary. The windings 402A and 402B are electrically configured and magnetically coupled as illustrated in FIG. 5 to provide the desired characteristics. FIG. 11b illustrates the coupled magnetics 400 electrically connected to a capacitor 403 to form a filter component. It will be readily apparent to one of ordinary skill in the art that the that the capacitor and coupled magnetics can be physically configured in a wide variety of ways, and that electrical connections can be provided in a number of configurations, including as part of a printed circuit board.

Figure 12A:
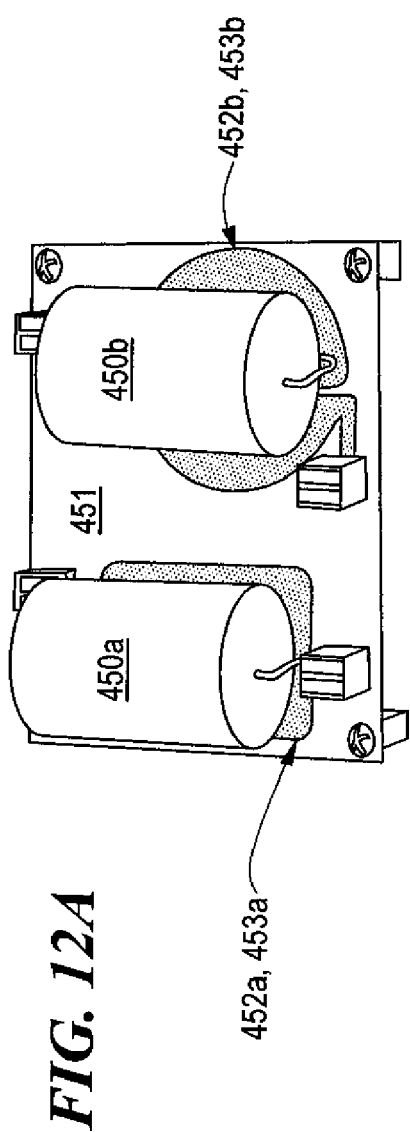
FIGS. 12A-C are a pictorial representation of an exemplary implementation of a component having inductance cancellation in accordance with the present invention.
Figure 12C:
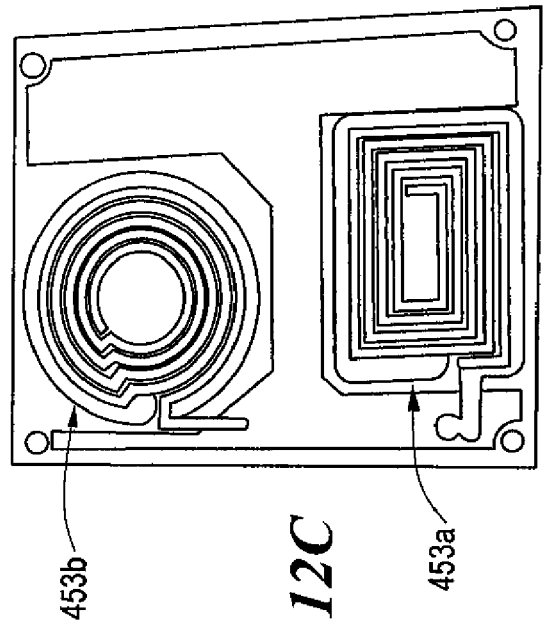
Figure 12B:
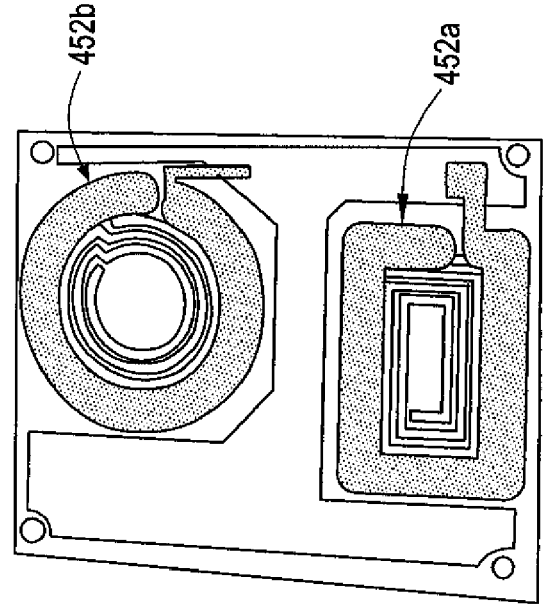

In a further embodiment shown in FIGS. 12A-C, the coupled windings are "printed" as part of a filter printed circuit board (PCB). FIG. 12A shows first and second capacitors 450a,450b mounted on a two-sided printed circuit board 451 with printed windings that realize inductance cancellation for each capacitor. The first capacitor 450a is connected to a pair of rectangular coupled windings 452a, 453a that are printed in the circuit board underneath the capacitor 450a. The second capacitor 450b is similarly connected to a pair of circular (spiral) coupled windings 452b, 453b. The pairs of coupled magnetic windings are each configured as illustrated in FIG. 5 to realize inductance cancellation.

FIG. 12B shows the top (component) side of printed circuit board 451 without the capacitors mounted so that the top side windings 452a, 452b (each corresponding to coil W1 in FIG. 5) can be seen. Similarly, FIG. 12C shows the bottom side of printed circuit board 451 so that the bottom side windings 453a, 453b (each corresponding to coil W2 in FIG. 5) can be seen. In addition to being relatively inexpensive, printing the magnetic windings on the PCB results in repeatable magnetic structures and interconnects. Again, an air-core structure is advantageous, though magnetic materials may be used.

As shown in FIG. 13A, a filter circuit 500 having inductance cancellation can include magnetic materials in the cancellation windings and an adaptive inductance cancellation feature. For example, adaptive inductance cancellation can be applicable for components having cancellation windings integrated into part of another filter or power converter component. The circuit 50 includes a capacitor C coupled to a cross-field magnetic structure 502, which includes a toroidal control coil 504 and coupled annular coils 506a and 506b wound on a magnetic core 508, as shown in FIG. 13B.

A feedback circuit 510 adjusts the current in the toroidal coil 504 to optimize the inductance cancellation provided by the annular coils 506a, 506b. The magnetic field generated by the winding 504 does not substantially link the windings 506a and 506b and vice versa, so there is no "transformer" action between the annular winding and the two toroidal windings.

In the illustrated embodiment, the coupled annular windings 506a and 506b can be referred to as the cancellation windings, which serve to realize the inductance cancellation technique. The toroidal winding 504, which can be referred to as the control winding, carries a low frequency control current that modulates the effective permeability of the magnetic material by driving it a controlled amount into saturation. The control winding 504 can thus control the effective magnetic coupling seen by the cancellation windings 506a and 506b. Using an electrically-controlled magnetic structure of this type (or another cross-field magnetic structure) the magnetic coupling can be adaptively controlled to maximize filter performance.

FIG. 13C illustrates a further illustrative embodiment having adaptive inductance cancellation. A filter circuit 550 includes coupled magnetics 551, a cross-field reactor 552, a feedback control circuit 553, and a capacitor 554. In the illustrated embodiment, coupled magnetics 551 implement the coupled windings for inductance cancellation (and for inductance in the other filter path), and may have other functions as well, depending on the application. Such other functions may include, for example, acting as power stage or filter magnetics in a power converter, or providing electrical isolation. The cross-field reactor 552 has an annular winding 555 in the electrical path between the coupled magnetics 550 and the capacitor 554. The annular winding 555 provides inductance in the capacitor path of the filter, which is electrically adjustable from a toroidal control winding 556. Using an electrically-controlled inductance of this type (or another cross-field magnetic structure), the total capacitor path inductance can be adaptively controlled to maximize filter performance. As will be appreciated by one of ordinary skill in the art, it is also possible to integrate the magnetic elements 551 and 552 into a single magnetic structure, and to include other functions into the magnetic structure as well.

As will be readily apparent to one of ordinary skill in the art, implementing accurate and repeatable cancellation of small shunt inductances can be particularly challenging in the case where magnetic materials are used, as the cancellation relies on very precise coupling between the windings, which in turn depends on the properties of the magnetic material. Any mismatch in the coupling (e.g., due to material or manufacturing variations, temperature changes, or mechanical stress or damage) can alter the effective shunt inductance and degrade the performance of the filter.

In general, the adaptive inductance cancellation feature of FIGS. 13A and 13C includes the coupling of the magnetic circuit under closed-loop control with feedback based on the characteristics of the filter waveforms. For example, techniques such as ripple correlation control may be employed to adapt for maximum filter performance. This adaptive inductance cancellation approach can achieve high filter performance while providing a high tolerance to manufacturing and environmental variations in both the magnetic elements and the shunt capacitor.

In another embodiment, coupled magnetic windings are combined with a capacitor to form an integrated filter element having inductance cancellation in accordance with the present invention. The integrated element can be provided as a single three-terminal device having a T model with one low-inductance branch, one capacitive branch (with extremely low inductance) and one high-inductance branch. Optionally, the integrated element can be provided as a single three-terminal device having a T model with two moderately inductive branches, and a capacitive branch with extremely low inductance. The coupled magnetics can be wound on, within, or as part of the capacitor.

FIG. 14 shows an exemplary component 600 having a capacitor 602 integrated with coupled first and second windings 604a,b. In the illustrated embodiment, the component 600 includes a wound (tubular) capacitor 602 with coupled magnetics 604a,b wound directly on top of the capacitor winding. The other end of the magnetic winding 604b is brought out as a terminal 604c. One side of the capacitor plate structure is connected internally to the internal end of winding 604a, and the other side of the capacitor plate structure is brought out externally as terminal 604d. In some cases, the magnetic windings can be made by extending the patterning of the capacitor foil or metallization. This arrangement minimizes the volume of the overall structure since the same volume is used for the capacitive and magnetic energy storage.

EXAMPLES

FIGS. 15A-C show various fabrication stages of an illustrative prototype filter element 700 having inductance cancellation in accordance with the present invention. Inductance cancellation magnetics 702a,b were wound on the outside of a United Chemi-Con U767D 2200 μF, 35 V electrolytic capacitor 704. A first (capacitor-path) winding 702a, which is shown as a foil winding, is added about the capacitor package. A second (inductive-path) winding 702b, which is shown as a wire winding, is placed over the first winding 702a. Use of the capacitor body as the winding form minimizes the overall volume of the filter element and illustrates the possibility of incorporating the coupled windings inside the capacitor package.

The capacitor-path winding 702a is wound with 1 inch wide, 1 mil thick copper tape, insulated with 1 mil mylar tape. One and three fourths turns on the capacitor body (circumference of 7.1 cm) were found to be sufficient to achieve a desired level of coupling. The inductive-path winding 702b is composed of several turns of 18 gauge magnet wire coiled tightly over the ac winding and glued in place. The two windings are soldered together at one end (forming one terminal), and the other end of the capacitor-path winding is soldered to the positive terminal of the capacitor. Because the coupling between the windings was not known a priori, a dc-winding tap point on the inductive-path winding yielding acceptable inductance cancellation in the capacitor path was determined experimentally. It is understood that this only need be done once for a given winding configuration, and can be done analytically as part of the design.

Despite the rudimentary construction, the prototype demonstrates significant performance improvement over known capacitors. The three-terminal filter element is only marginally larger than the original capacitor. The action of the coupled windings was found to cancel the effective capacitor-path inductance down to approximately 15-25% of its original value, while providing over 700 nH of series-path filter inductance.

Figure 16:
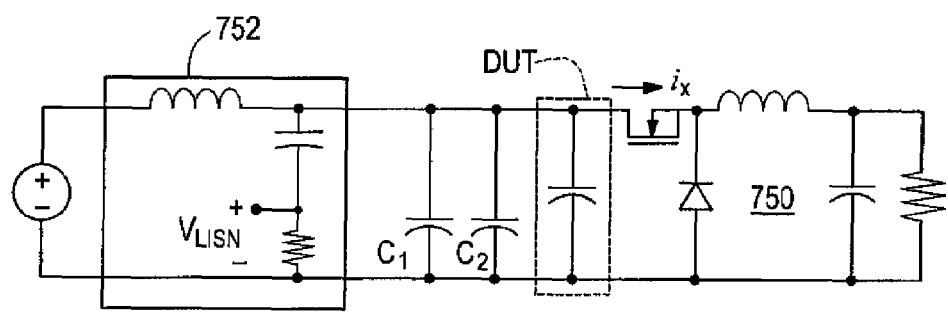
FIG. 16 is a schematic depiction of an exemplary circuit for evaluating a component having inductance cancellation in accordance with the present invention.

The effectiveness of the prototype filter element for attenuating conducted Electromagnetic Interference (EMI) was measured using the test setup of FIG. 16. A device under test DUT, i.e., the integrated filter 700 of FIG. 15C and a conventional capacitor, were used as the principle low-pass filter element at the input of a buck converter 750. As is typical in converter input filters, small high-frequency capacitors $C_1$, $C_2$ were added in parallel with the device under test DUT. Attenuation performance was evaluated using conventional EMI measurement techniques. Ripple was evaluated at the measurement port of a Line Impedance Stabilization Network (LISN) 752 in A-B comparisons between a capacitor and the prototype filter element.

Figure 16A:
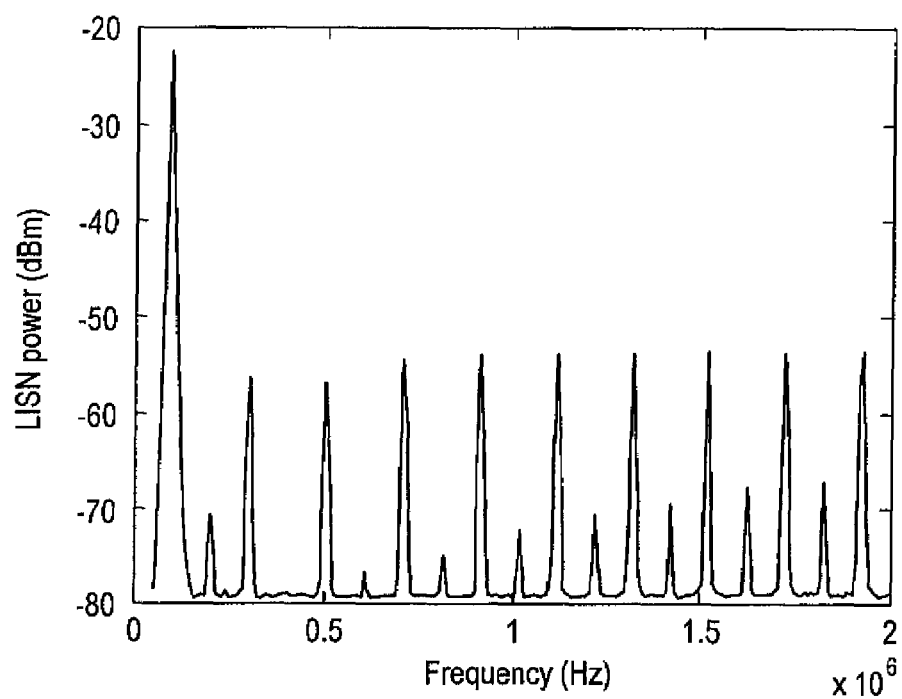
FIG. 16A is a graphical representation of power over frequency for a conventional capacitor.
Figure 16B:
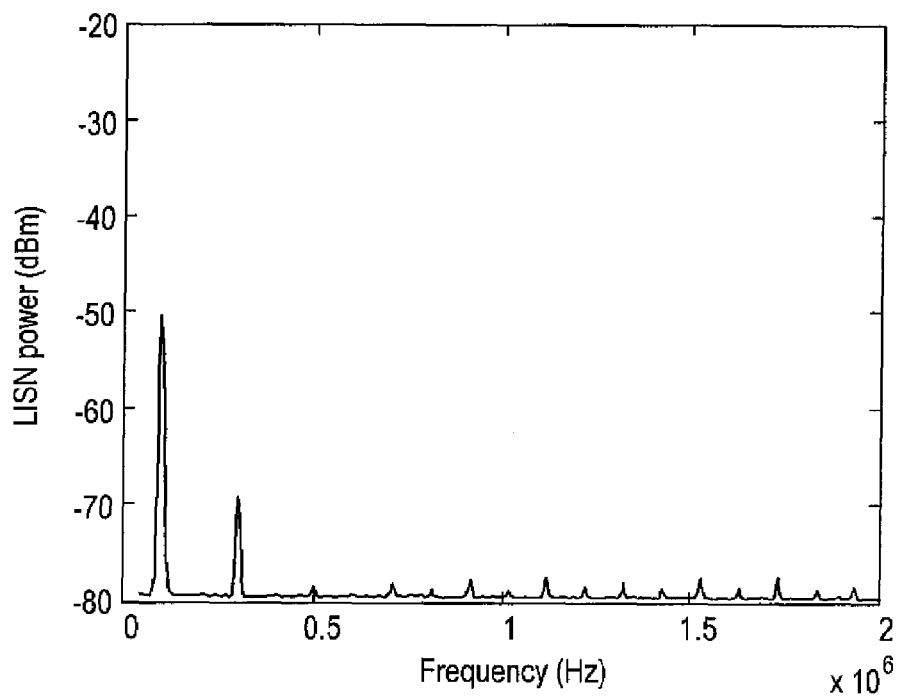
FIG. 16B is a graphical representation of power over frequency for a component having inductance cancellation in accordance with the present invention.

Relative performance is shown in FIGS. 16A (capacitor) and 16B (prototype). As can be seen, the attenuation of the prototype filter element 700 exceeds that of the capacitor alone by over 25 dB (a factor of 17) across the entire measured spectrum (100 kHz-2 MHz). This represents a significant improvement in filtration capability without a significant increase in component volume. Furthermore, further performance improvements are expected when the invention is refined over the prototype.

Figure 17A:
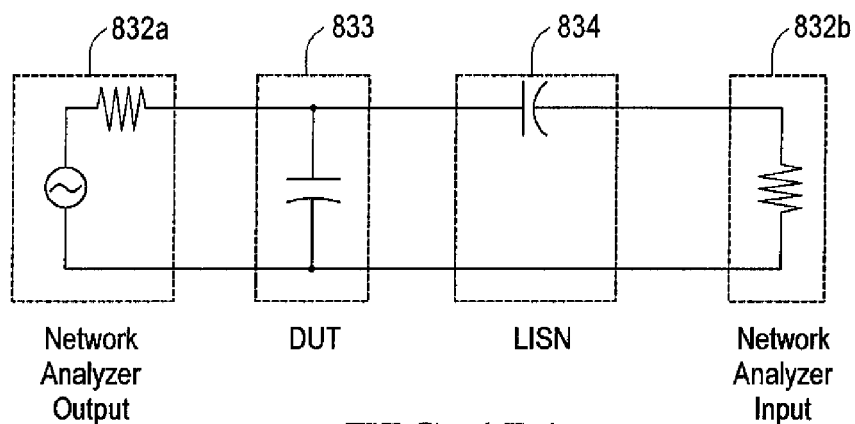
FIG. 17A is an illustration of a test setup useful for evaluating the attenuation performance of capacitors, components, and filters.

A second example also serves to demonstrate the approach. FIG. 17A illustrates a measurement system suitable for evaluating the attenuation performance of capacitors, filter components, and filters. A drive signal is injected from the 50 Ohm output of a network analyzer 832a into the device under test (DUT) (i.e. a capacitor and a capacitor plus cancellation windings), and the resulting filter output is measured at the 50 Ohm network analyzer input 832b via the line impedance stabilization network (LISN) 834. The response thus measures the ability of the DUT to attenuate an input signal.

Figure 17B:
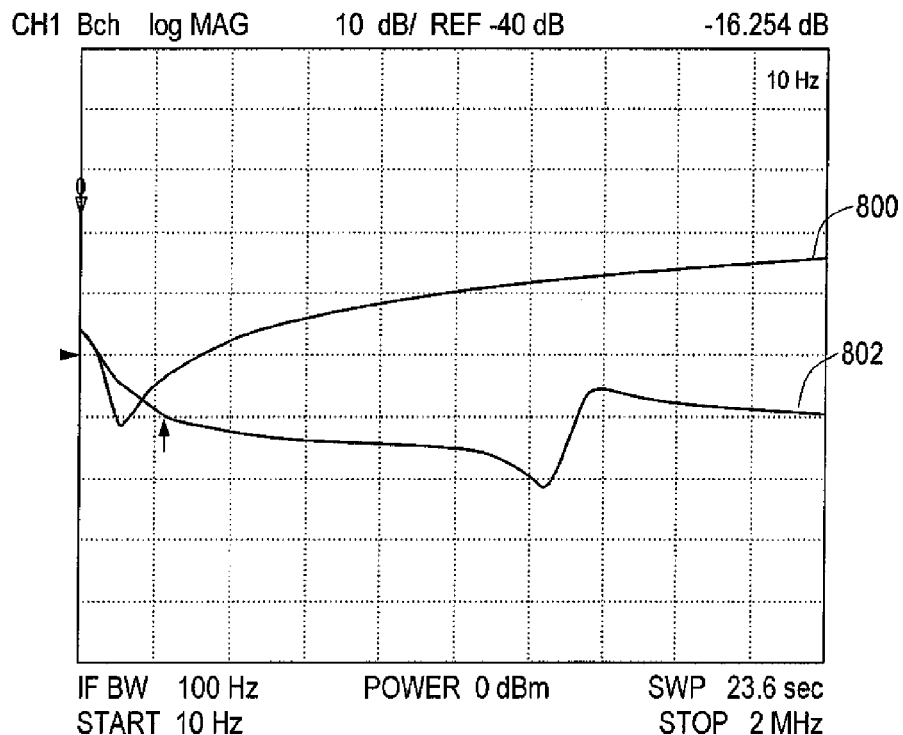
FIG. 17B is a graphical depiction of power over frequency for a conventional capacitor and a component having inductance cancellation in accordance with the present invention.

FIG. 17B shows the performance of a capacitor alone 800 and a component 802 having inductance cancellation in accordance with the present invention, such as the device shown in FIG. 12A implemented with Cornell Dubilier 935C4W10K capacitors (10 µF, 400 V). A first curve 800 shows the signal power measured with the capacitor alone. The minimum of the curve (between 100 and 200 kHz) illustrates where the filter capacitor reaches its self resonance; at higher frequencies it appears inductive and does not attenuate the input as well. A second curve 802 shows the performance with the cancellation windings. As can be seen, the attenuation remains high out to significantly higher frequencies, and performs at least a factor of 10 (20 dB) better for all frequencies above about 600 kHz. A resonant peaking appears around 1.4 MHz, where the capacitor used in the prototype has a secondary resonance and its effective ESL changes slightly. These curves demonstrate the high effectiveness of the present invention for improving filtration performance along with the viability of using printed circuit board cancellation windings.

Figure 17C:
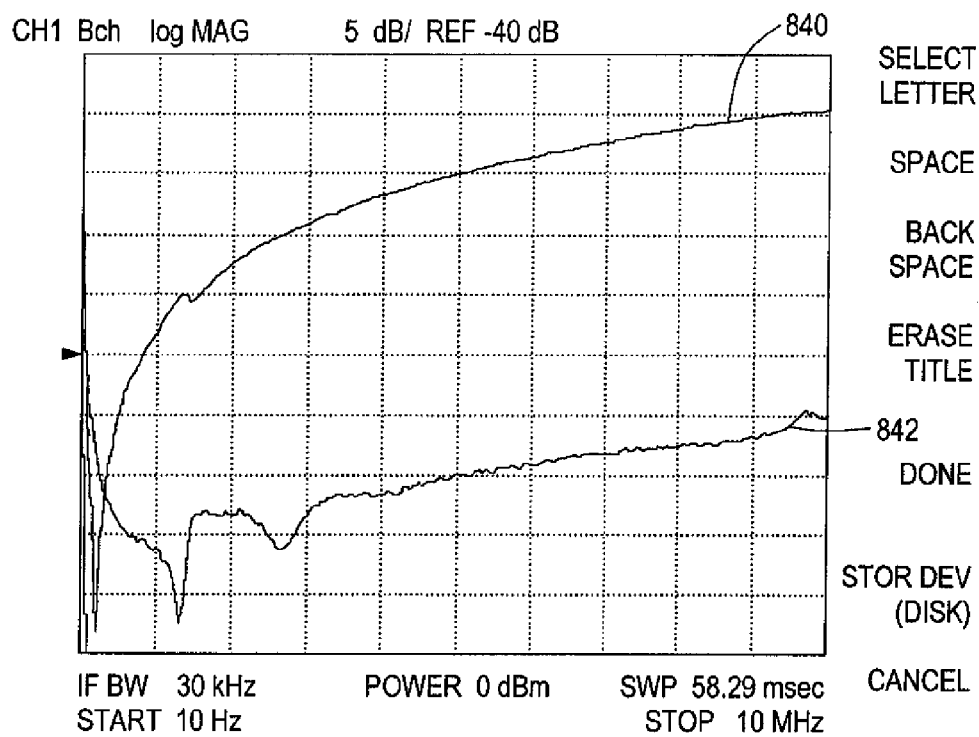
FIG. 17C is a graphical depiction of power over frequency for a conventional capacitor and a component having inductance cancellation in accordance with the present invention.

As shown in FIG. 17C, a third example serves to demonstrate the present invention with the coupled winding configuration of FIG. 6. A prototype filter element was constructed in a manner similar to the fashion illustrated in FIGS. 4D-F. A Cornell-Dubilier 935C4W10K capacitor (10 µF, 400 V) having a diameter of 1.5 inches was wound with 2 turns of 1 mil thick 550 mil wide copper foil insulated on one side with 1 mil thick mylar tape. The winding was tapped at the 2-turn point and connected to one terminal of the capacitor. The winding was then continued for an additional 1.5 turns. The end point of the winding was selected to provide good inductance cancellation based on the ability of the circuit to attenuate an input signal. FIG. 17C shows the measured performance of the prototype device and a capacitor alone using the test setup of FIG. 17A. A first curve 840 (in FIG. 17C) shows the signal power measured with the capacitor alone. The minimum of the curve 840 illustrates where the filter capacitor reaches its self resonance; at higher frequencies it appears inductive and does not attenuate the input as well. A second curve 842 shows the performance with the cancellation windings. With the cancellation windings the attenuation is substantially better (>20 dB) at high frequencies. A resonant peaking appears around 1.4 MHz, where the secondary resonance peculiar to this capacitor occurs (and where its effective ESL changes slightly). These results demonstrate the efficacy of the present invention with the winding configuration of FIG. 6, and illustrate the possibility of integrating the tapped winding structure with the capacitor.

Figure 18:
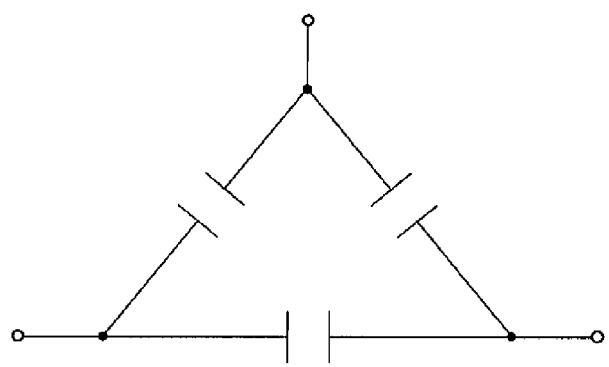
FIG. 18 is a schematic depiction of a delta model of the capacitance of an electrode network.

In another aspect of the invention, the parasitic capacitance of magnetic elements, such as inductors, can be effectively cancelled through proper capacitive coupling of a network of electrodes. It is understood that conservation of energy laws prohibit passive realization of a two-terminal negative capacitance. However, a multi-electrode network may exhibit an apparent negative capacitance in a single branch of a delta network model, which is shown in FIG. 18, as long as certain physical constraints are met. One of ordinary skill in the art will recognize that such an arrangement is the dual of the coupled magnetic embodiments described above. Proper application of such coupled electrodes may be effective in addressing the high-frequency limitations of inductors, thereby further improving achievable filter performance.

Figure 19A:
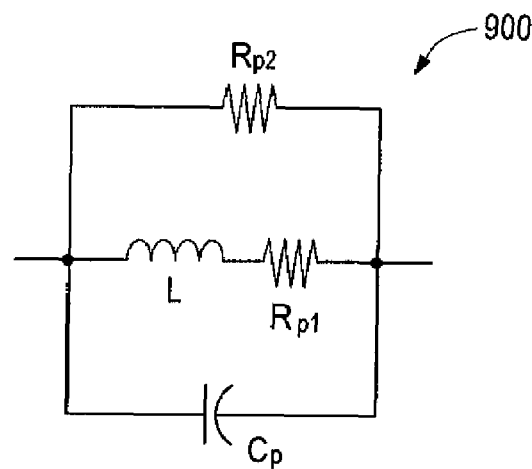
FIG. 19A is a schematic depiction of a prior art model of a filter inductor.

FIG. 19A shows a prior-art model for a conventional filter inductor L, including parasitic resistances $R_{P1}$ and $R_{P2}$, and parasitic capacitance $C_P$. The parasitic capacitance arises from interwinding capacitance of the inductor and other effects. It is of particular significance in filter applications because it limits the component's ability to attenuate voltage ripple at high frequencies: the magnitude of the impedance falls off above the self resonance of the inductance and the parasitic capacitance.

Figure 19B:
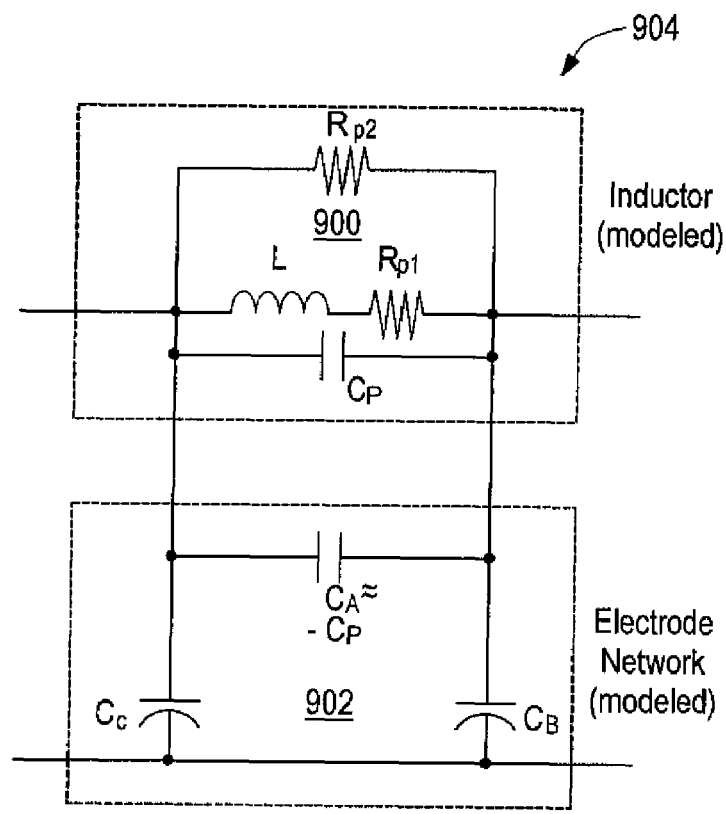
FIG. 19B is a schematic depiction of the connection of a coupled electrode network with an inductor to form a component having capacitance cancellation in accordance with the present invention.
Figure 20:
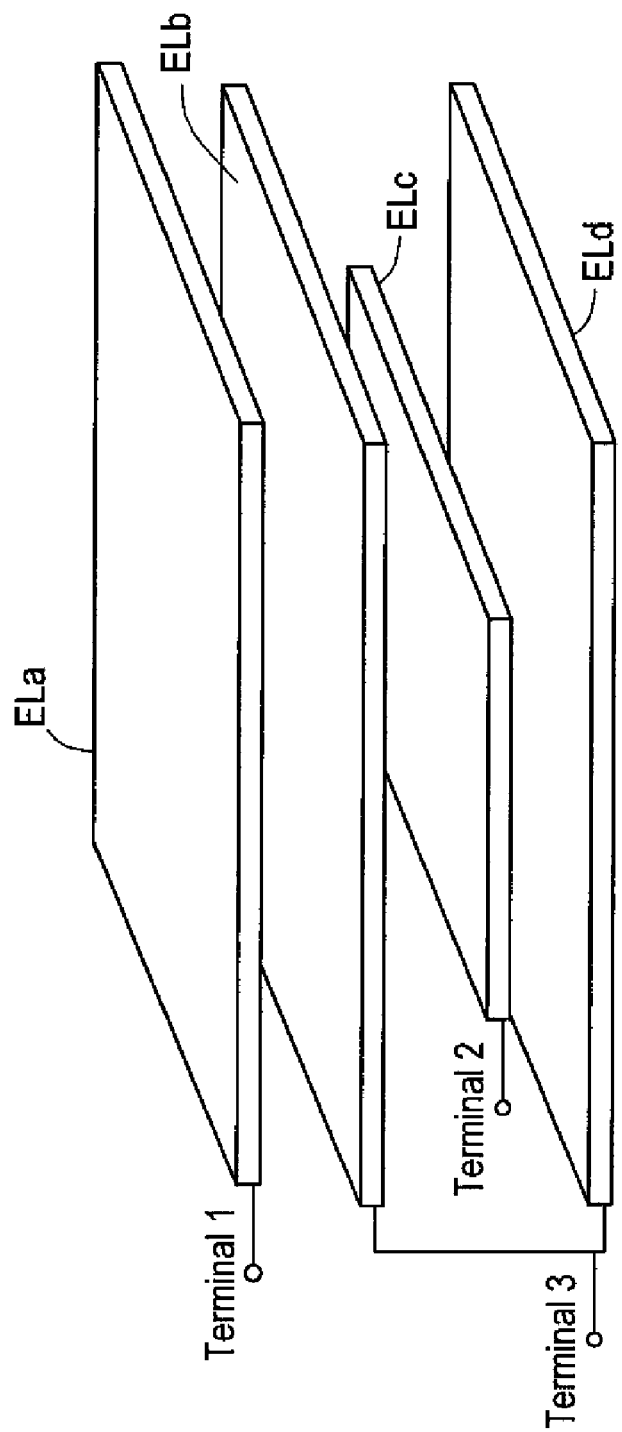
FIG. 20 is a pictorial representation of a coupled electrode network in accordance with the present invention.

In accordance with the present invention, and as illustrated in FIG. 19B, interconnection of the inductor L, which can be modeled using the model 900 of FIG. 19A, with an electrode network 902 having an appropriate characteristic (e.g. having a delta model in which one branch of the delta appears as a negative capacitance) provides a component 904 with improved performance. The component 904 has relatively low effective capacitance across the nodes to which the inductor is connected (due to capacitance cancellation), and provides additional filter capacitance from each of those nodes to the third node. An exemplary structure having a plurality of electrodes ELa-d is illustrated in FIG. 20.

The present invention provides a novel filtering technique that overcomes the high-frequency limitations of known filter capacitors. Coupled magnetic windings are used to cancel filter capacitor-path inductance (e.g., due to capacitor and interconnect parasitics) and provide filter inductance in another filter path. This arrangement is advantageous since the amount of attenuation provided by a filter stage depends directly on the mismatch between the impedances of the two paths.

The invention is useful in the design of filters and in the design of integrated filter elements. In one aspect of the invention, discrete coupled windings are used to cancel capacitor and interconnect inductance in the filter capacitive path. The coupled windings may be wound or printed, and may also incorporate adaptive control of the inductance cancellation. In another aspect of the invention, the magnetic windings are incorporated with the capacitor to form an integrated filter component. The integrated element utilizes the inventive inductance cancellation technique to realize both a capacitive path having extremely low effective ESL and an inductive path.

In another aspect of the invention, a method of constructing a filter element having inductance cancellation includes coupling windings to a capacitor. As described above in detail, a transformer can be designed and combined with a capacitor having an unwanted parasitic inductance to create an integrated filter element that compensates for the parasitic inductance of the capacitor. An integrated filter element, for example, can be fabricated from an inductance cancellation transformer and connection and packaging with a capacitor. The resultant filter element has greatly improved performance as compared to a capacitor at a relatively low manufacturing cost for the filter element.

Figure 21:
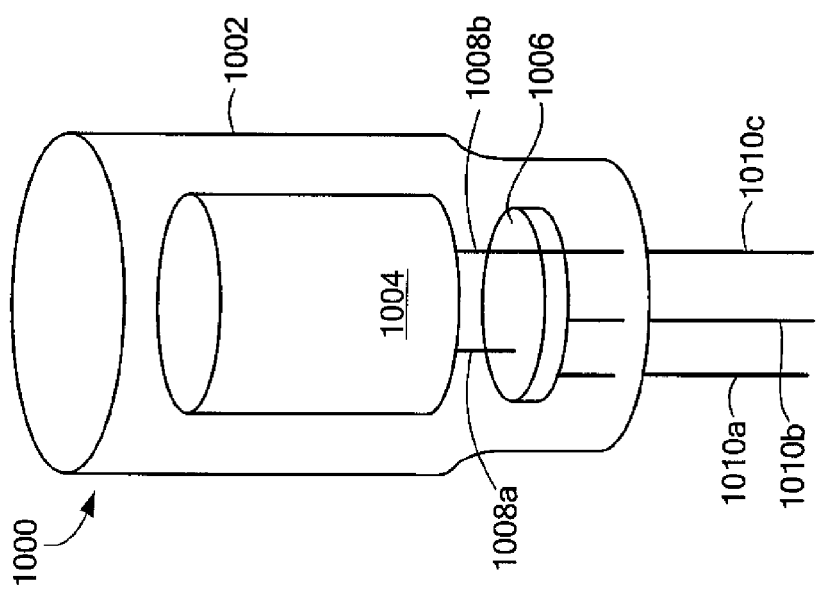
FIG. 21 is a schematic depiction of an integrated filter element having inductance cancellation.

FIG. 21 shows an exemplary electrical component 1000 having inductance cancellation. The component 1000 includes a case 1002 containing a capacitor 1004 and a transformer 1006. The capacitor 1004 provides the principal source of capacitance in the component 1000. In the illustrated embodiment, the capacitor 1004 includes first and second terminals 1008a, b coupled to the transformer 1006 to provide a three terminal 1010a, b, c component.

The case 1002 refers to the housing or wrapping of the element. It is understood that in general, the case 1002 will house the capacitor 1004 and/or transformer 1006. However, it is understood that embodiments are contemplated in which the capacitor 1004 and/or transformer 1006, may be disposed wholly or partially outside of the case 1002 without departing from the invention. In addition, it is understood that other embodiments may not include a case at all.

In an exemplary embodiment, the capacitor 1004 includes first and second terminals 1008 a,b one of which is coupled to the transformer 1006. In one embodiment, the transformer 1006 includes a coreless or "air" core transformer winding made up of a conductor (e.g. copper) insulated with a non-conducting material. The transformer 1006 is connected to a terminal of the capacitor 1004 and these are packaged together in the case 1002, as described more fully below.

The integrated element 1000 is constructed in a series of tasks including: forming a patterned winding from a conductor, electrically insulating the winding as necessary, reshaping the winding as necessary such that a transformer is formed, and connecting the transformer to the capacitor to form the integrated element.

In one particular embodiment, the patterned winding is formed as a planar structure that can be reshaped (e.g., by bending) into the desired transformer geometry. In general, the patterned winding can be made from a suitable conductor and can be formed by a variety of processes, such as stamping, punching, cutting, etching, lasing, etc, a sheet of conductive material. The winding can be formed from a wire or thin strip of conductor that is bent, folded, or shaped into the pattern. The winding can be cut directly from a sheet of conductor, for example by a laser cutter or water-jet tool. The winding can be extruded and cut to a desired thickness. Note that the patterned winding thickness can be selected to provide a desired DC or AC resistance.

Figure 22:
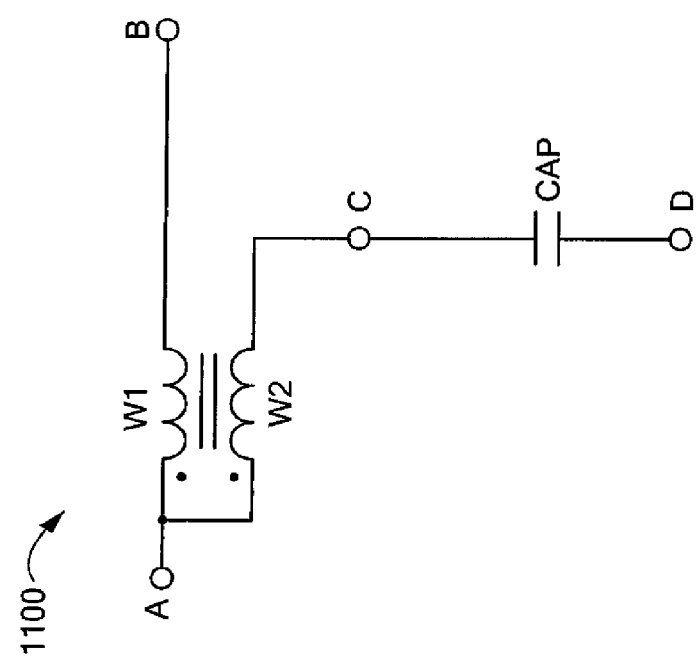
FIG. 22 is a schematic diagram of a circuit having end-tapped windings to cancel inductance of a capacitor.

FIG. 22 shows an exemplary end-tapped winding circuit 1100 having first and second coupled windings W1, W2 coupled to a capacitor CAP to cancel parasitic inductance. The first winding W1 is disposed between first and second terminals A, B and the second winding W2 is disposed between the first terminal A and a third terminal C. The capacitor CAP has a first end coupled to the third terminal C and a second end that can form a fourth terminal D. The first, second, and fourth terminals A, B, D can extend from the component or otherwise form connection points, such as the component terminals 1010a, b, c of FIG. 21.

Figure 22B:
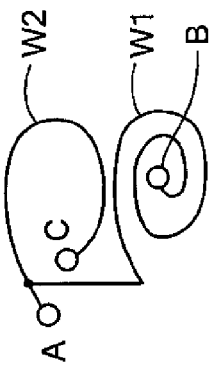
FIG. 22B is a further pictorial representation of a physical implementation of the circuit of FIG. 22.
Figure 22A:
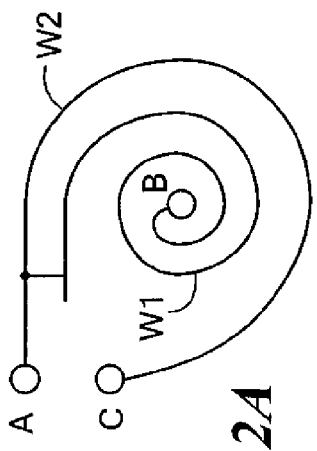
FIG. 22A is a pictorial representation of a physical implementation of the circuit of FIG. 22.

FIG. 22A shows an exemplary end-tapped structure for the coupled windings W1, W2 of FIG. 22 formed as a planar pattern. FIG. 22B shows an alternative layered structure for the transformer. The transformer has first and second winding layers having windings W1, W2, which can be formed from a planar patterned winding folded into multiple layers. Alternatively, the layered structure of FIG. 22B can be formed as multiple planar winding patterns stacked (disposed vertically) and interconnected.

Figure 23A:
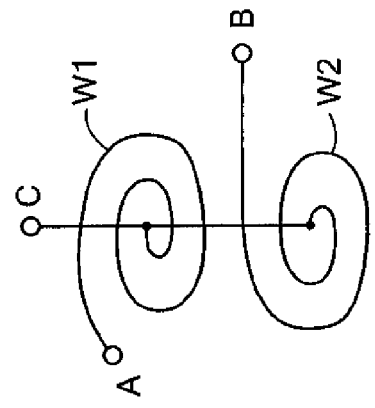
FIG. 23A is a pictorial representation of a physical implementation of the circuit of FIG. 23.
Figure 23:
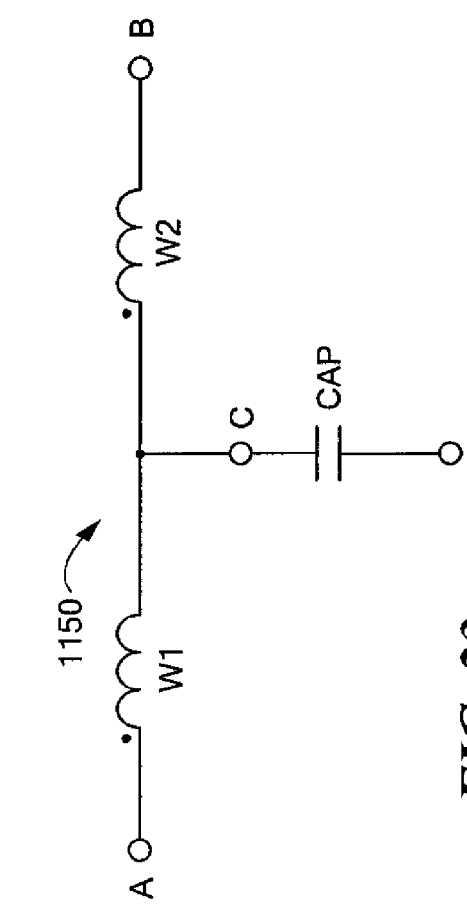
FIG. 23 is a schematic diagram of a circuit having center-tapped windings to cancel inductance of a capacitor.

FIG. 23 shows an exemplary center-tapped circuit 1150 for the coupled windings W1, W2 having first, second and third terminals A, B, C where the third terminal C is located between the first and second windings W1, W2 and is coupled to the capacitor CAP. FIG. 23A shows an illustrative layered arrangement of the center-tapped windings W1, W2.

Figure 24:
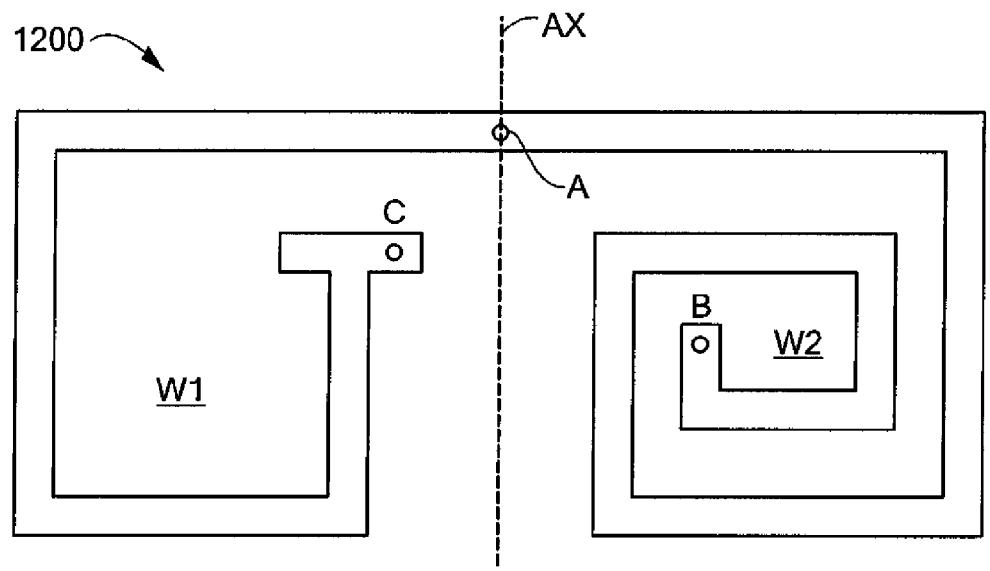
FIG. 24 is a pictorial representation of the end-tapped windings of FIG. 22 formed from a conductive foil.

FIG. 24 shows an exemplary end-tapped patterned winding structure 1200 in which the windings W1, W2 are formed from a conductive material, such as copper, in a relatively flat structure, such as sheet or foil. The end-tapped structure 1200 can provide the windings W1, W2 of FIG. 22. The structure 1200 can be folded about an axis AX aligned with the first terminal A resulting in the desired winding geometry and coupling characteristics. It is understood that the desired magnetic coupling is achieved by the geometry of the windings.

Figure 24A:
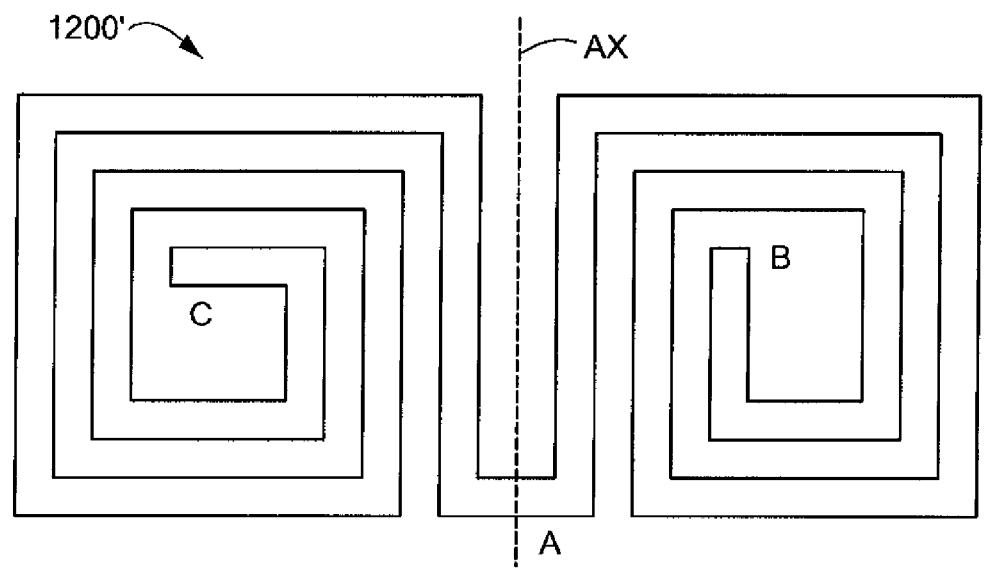
FIG. 24A is a further pictorial representation of the end-tapped windings of FIG. 22 formed from a conductive foil.

FIG. 24A shows a further exemplary end-tapped winding structure 1200' formed from copper foil, for example. The windings W1, W2 are folded about an axis AX to form the desired characteristics.

While folding is shown about an axis to provide 180 degree folding, it is understood that any folding angle can be used to achieve the desired geometry. In addition, it is further understood that multiple folds can be performed to arrive at a particular geometry for the windings.

Figure 25:
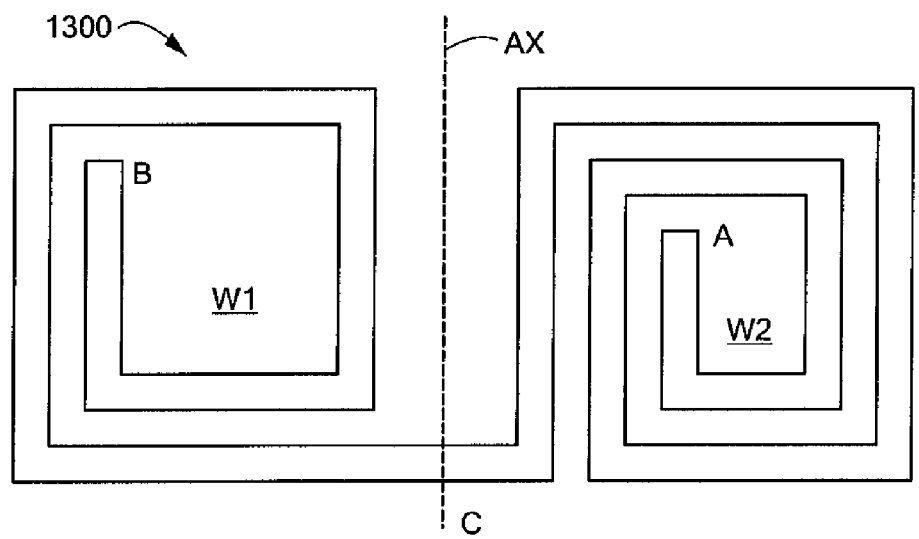
FIG. 25 is a pictorial representation of the center-tapped windings of FIG. 23 formed from a conductive foil.
Figure 25A:
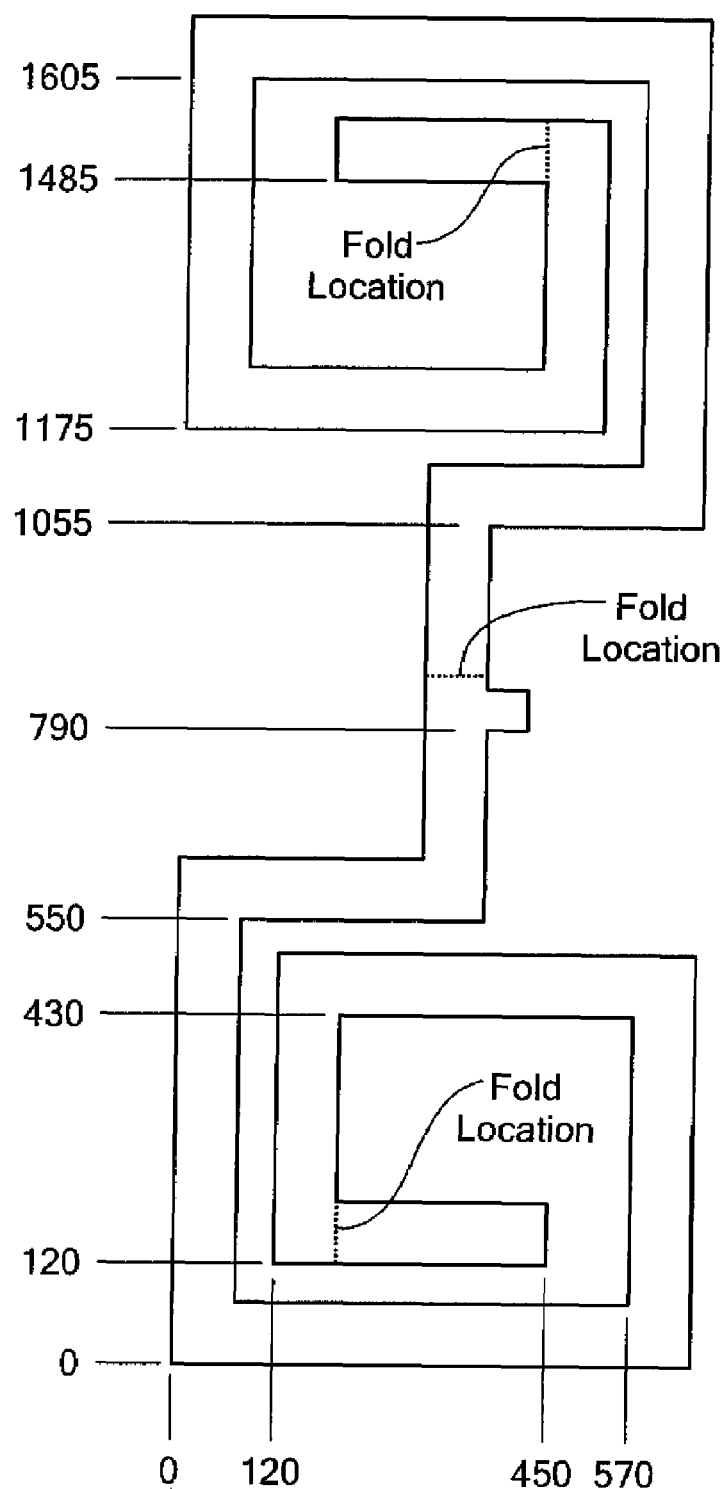
FIG. 25A is another pictorial winding representation of a center-tapped winding.

FIG. 25 shows an exemplary center-tapped winding structure 1300 formed from copper foil, for example, in which the first and second windings W1, W2 are folded about an axis AX aligned with the third terminal C. The center-tapped structure 1300 can provide the windings W1, W2 of FIG. 23. FIG. 25A shows an exemplary center-tapped winding structure with illustrative dimensions in mils.

In general, the patterned winding may be reshaped, such as by folding the winding to form the transformer. A multilayer coreless transformer can be made by folding the planar winding pattern into multiple sections that are coupled magnetically. Note that it is also possible to leave the winding un-insulated, and fold it in such a manner that the spacing of the fold forms the insulation between layers.

It is understood that the winding shape can be made to conform to a desired structure, such as a capacitor form factor, with appropriate terminals for welding, soldering, etc., the interconnects. Additional tabs and other structures can be provided to form desired terminals, leads, and the like, both in and out of plane. Further, holes can be formed in the foil windings to achieve a desired effect.

In general, the patterned winding may be insulated to ensure that it will not make an unwanted electrical connection when formed into the transformer. This insulation can be applied in a variety of ways. The conductor can be sprayed, painted, printed, or dipped into a chemical that forms an insulation layer. In addition, some metals, e.g., Aluminum, can be treated to form an insulation layer, such as oxide. An insulating sheet can be placed onto the winding with or without adhesive. These insulation processes can be carried out either on the patterned winding or on the conductor before the pattern is formed. (e.g., a sheet of conductor that is coated with an insulation layer, e.g., Kapton, can be stamped or an insulation layer can be formed on the patterned winding). The entirety of the structure can be covered with insulating material, which can then be removed at desired locations.

Figure 26:
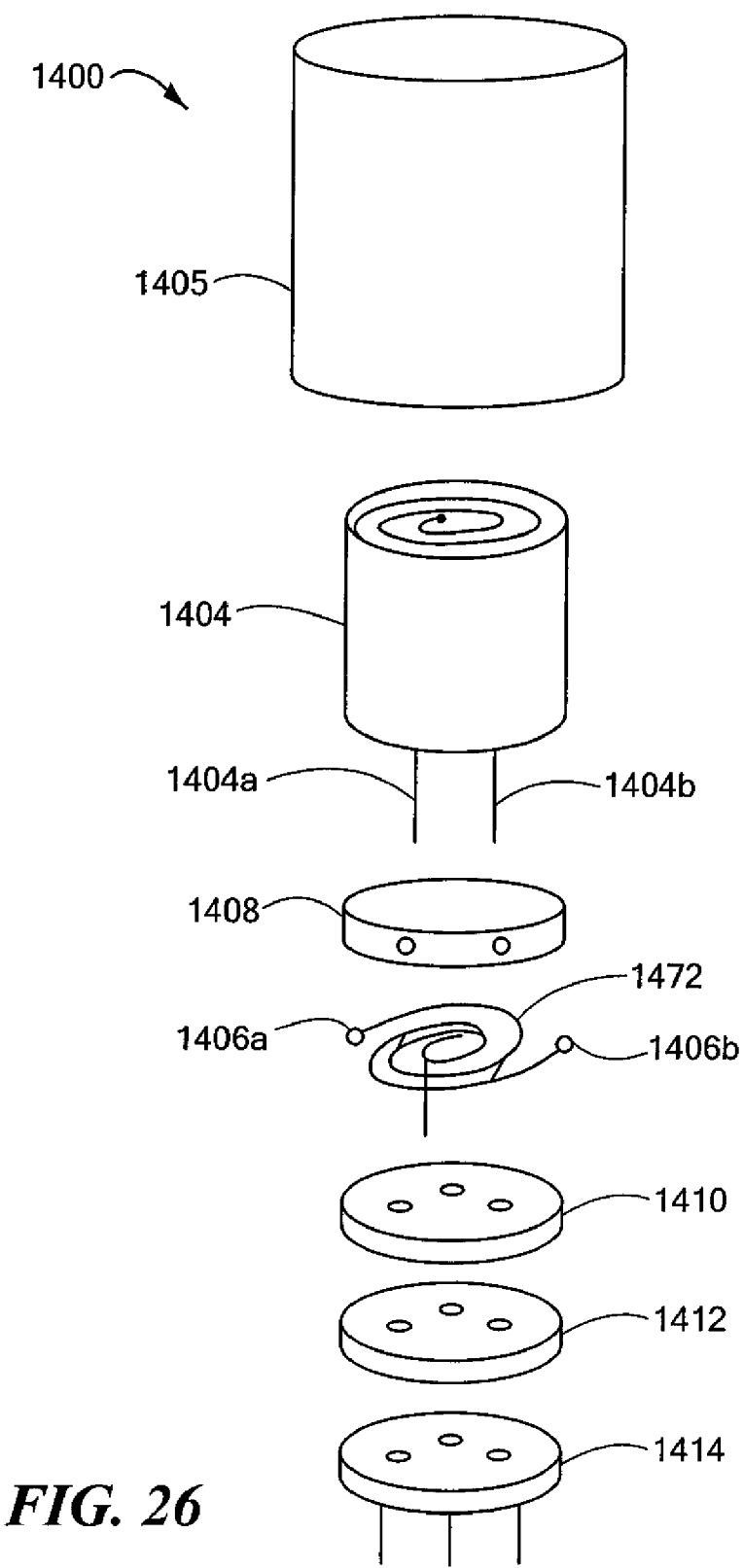
FIG. 26 is an exploded pictorial representation of an exemplary inductance-canceling filter element.

In an exemplary embodiment of an inductance-canceling integrated filter element 1400 shown in FIG. 26, a transformer 1402 is connected to a capacitor 1404 and packaged together in a case 1405 to form the integrated filter element. In one embodiment, the transformer 1402 is connected to one terminal 1404a or plate of the capacitor, and the other terminal of the capacitor 1404b and two additional connections 1406a,b on the transformer are brought out (e.g. by leads) to form a three-terminal integrated filter element. (Note that variants such as four terminals brought out externally are also possible.)

It is understood that the positions of the connections to the transformer 1402 will depend on whether the transformer is a center-tapped or an end-tapped design, as described above, and on the design of the winding. Connections can be made in similar manners as those used for capacitor terminals (e.g. welding). To reduce the number of interconnections, the two external terminal leads to the transformer may be a part of the original winding pattern that are formed (e.g. bent) appropriately.

The integrated filter element 1400 can include further elements to achieve a desired spacing between the capacitor plate roll 1404 or interconnect and the transformer 1402, and between the transformer 1402 and the device terminals. The spacings are typically controlled to achieve the desired filtering performance, to make the transformer behavior insensitive to variations in external conditions, and to meet voltage breakdown, creepage, and clearance requirements that may exist.

The spacing may be controlled using a variety of techniques and/or components including 1) placing one or more insulating mechanical spacers (e.g. between capacitor and transformer, transformer and external connection), 2) setting the desired spacing by one or more potting steps (e.g. potting capacitor windings, then positioning and potting the transformer windings), 3) interconnecting through one or more fluid proof bungs (e.g. for an electrolytic filter element), 4) controlling the insulator layer thickness(es) in the transformer winding, and 5) a combination of the above.

The illustrative filter element 1400 includes a non-conductive spacer 1408 between the capacitor 1404 and the transformer 1402 and a further spacer 1410 on the other side of the transformer. A bung 1412 can abut the further spacer 1410 to contain a fluid material inserted into the capacitor 1404, for example. The element 1400 can also include a terminal block 1414 for larger devices for example, that can be integrated with the bung. Potting can be flowed into the case as desired.

It is understood that the various spacers, bungs, and terminal blocks are optional in certain embodiments as will be readily apparent to one of ordinary skill in the art.

Figure 27A:
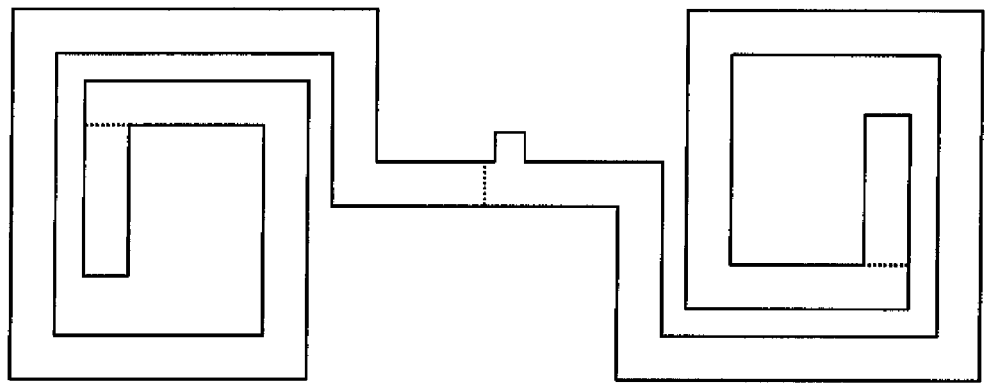
FIGS. 27A-D show an exemplary construction sequence for an inductive canceling filter element.
Figure 27B:
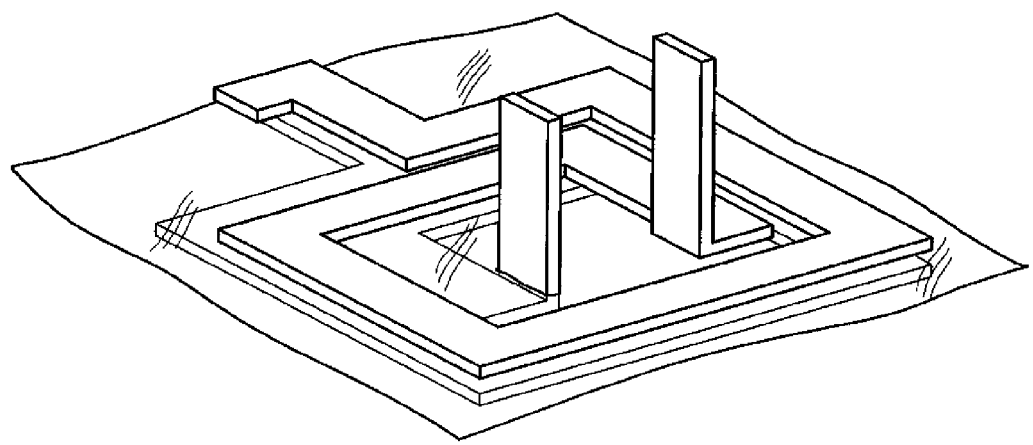

A prototype filter element having inductance cancellation was constructed and tested. The winding was designed for a 3.3 µH X-Type capacitor from BC components (Part No. 2222 338 24335). The winding, which is shown in FIG. 27A, includes a 1650 by 700 millimeter (mil) set of coils that can be folded into a 825 by 700 mil two-layer center-tapped transformer with over 1 full turn on both the primary and secondary. This winding is made out of a 10 mil think sheet of copper and was cut using a water-jet cutter. A layer of 1 mil thick, clear insulation foil is glued down to one side of the winding to form the insulation later. The winding is folded to form the transformer shown in FIG. 27B and soldered to the cathode on the base of the capacitor as shown in FIG. 27C. Two leads extend from the transformer away from the capacitor. A 50 mil thick layer of epoxy is them poured onto the base of the capacitor that will totally envelop the transformer, but not the extended leads. The resultant inductance canceling filter circuit is shown in FIG. 27D.

Figure 27D:
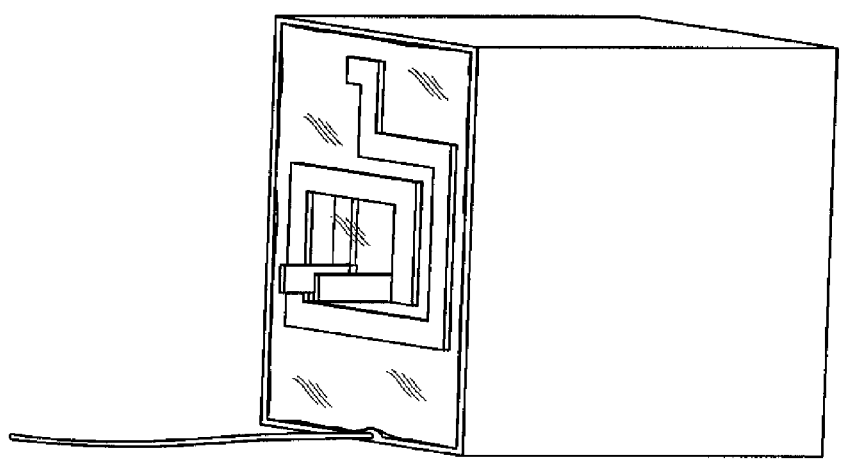
Figure 27C:
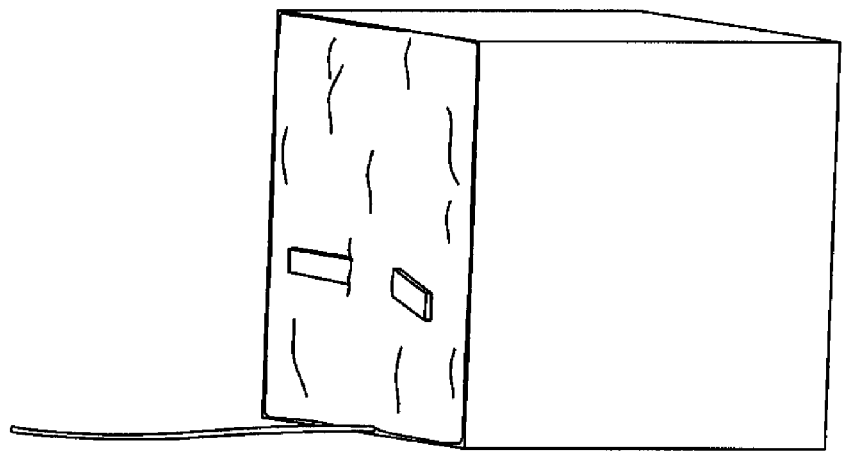
Figure 28:
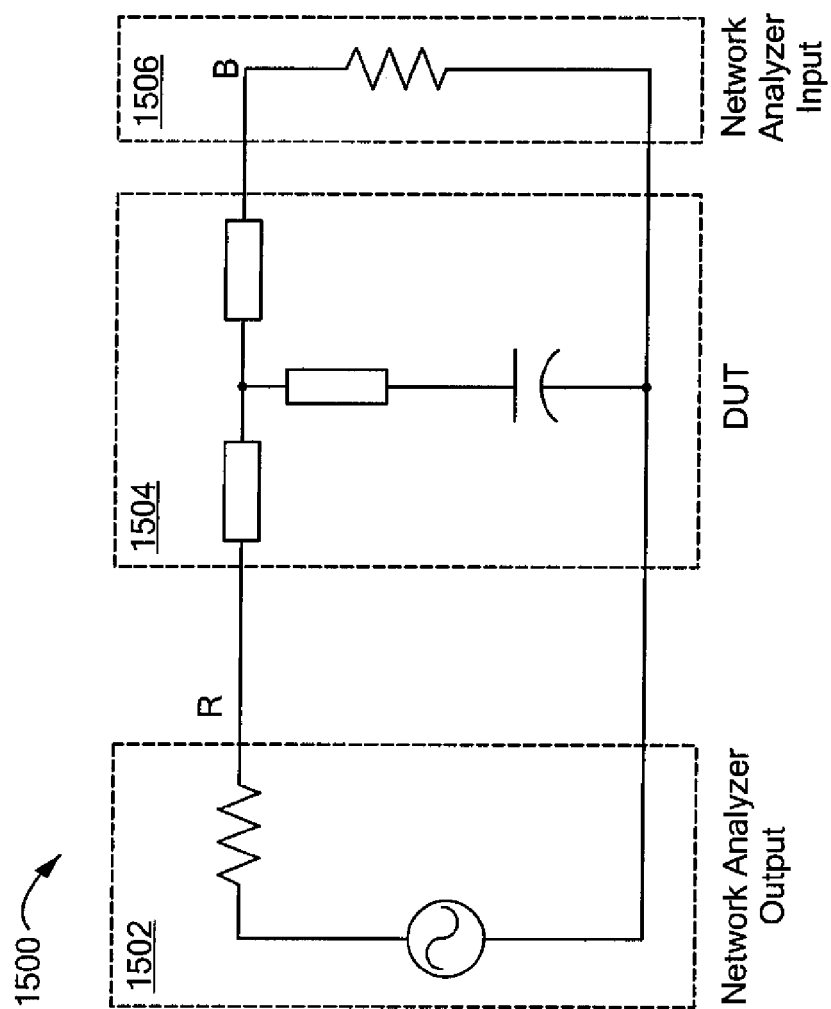
FIG. 28 shows an exemplary test set up to test an inductive canceling filter element.
Figure 29:
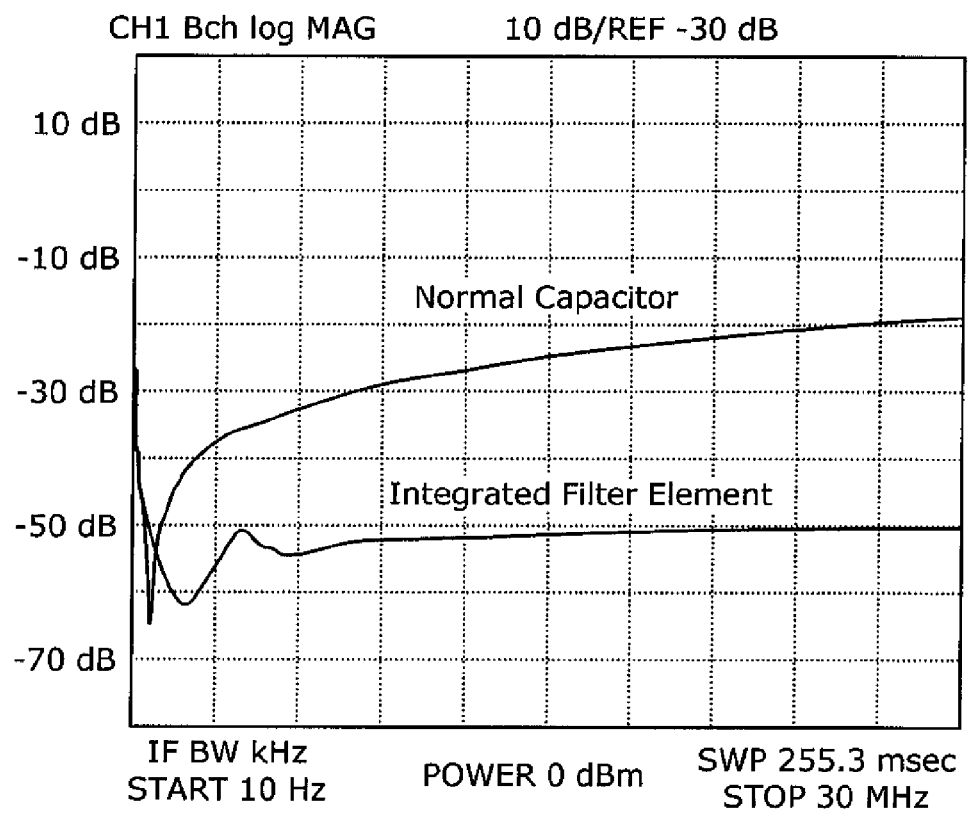
FIG. 29 is a graphical depiction of test results of a capacitor and a an inductive canceling filter element.

FIG. 28 shows an exemplary test set up 1500 for the inventive inductance canceling filter element of FIG. 27D. The output of a network analyzer 1502 drives an input port of the device under test (DUT) 1504, e.g., the filter element. An output port of the DUT 1504 is connected to the network analyzer input 1506. Test results in FIG. 29 show over a 20 dB improvement in attenuation for a wide range of frequencies for the inventive filter element 1550 as compared to the discrete capacitor 1552.

Figure 30:
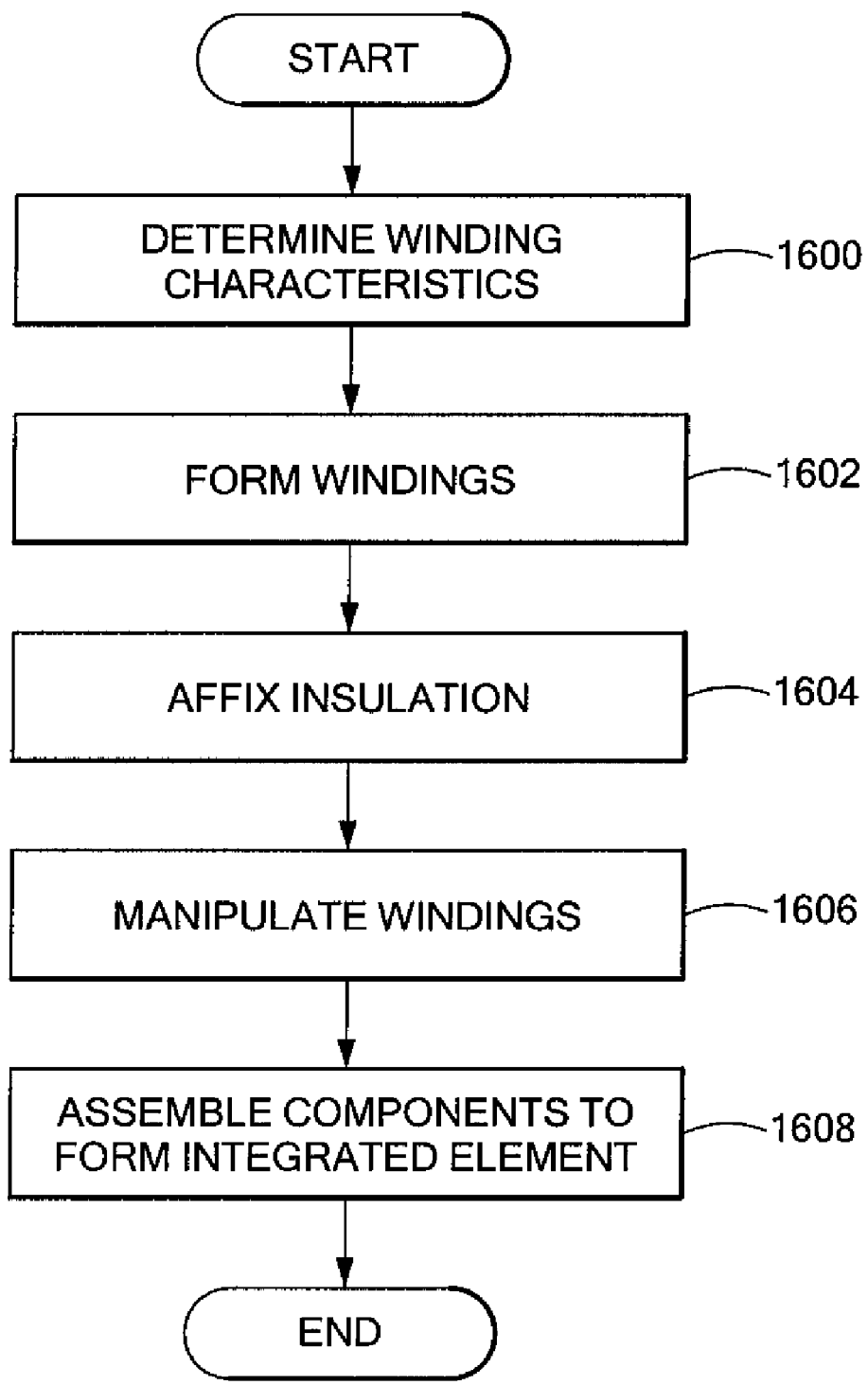
FIG. 30 is a flow diagram showing an exemplary sequence of steps to fabricate an inductive canceling filter element.

FIG. 30 shows an exemplary sequence of steps to fabricate a filter element having inductance cancellation. In step 1600, it is determined the characteristics desired for the windings of the integrated filter element. Exemplary factors in determining the desired winding characteristics include capacitor capacitance, capacitor parasitic impedance, interconnect impedance, and component geometries. The windings are formed in step 1602 by stamping, cutting, or the like, a conductive foil, such as copper. It is understood that a wide range of manual, semi-automatic, and automatic techniques and systems can be used to form the windings from a conductive material.

In step 1604, the windings can be insulated to prevent undesired connections in the circuit. In step 1606, the windings are manipulated, such as by folding, to achieve the geometry corresponding to the selected impedance characteristics. The filter element is then assembled in step 1608 to provide an integrated filter element. In an exemplary embodiment, the capacitor and the windings are electrically coupled and inserted into a case. An optional spacer can be inserted between the capacitor and windings and/or between the windings and an optional bung for electrolytic capacitors, for example. An optional terminal block can be also be used to facilitate terminal connections.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A method of fabricating an electrical filter component, comprising:
    patterning a conductor to create discrete magnetically-coupled windings; and
    electrically coupling the discrete magnetically-coupled windings to a capacitor having first and second terminals such that magnetic induction of the magnetically-coupled windings provides capacitor-path inductance cancellation,
    wherein induction of the windings generates a voltage that counteracts a voltage due to equivalent series inductance of the capacitor and does not counteract a voltage due to the capacitance of the capacitor.

2. The method according to claim 1, further including patterning the conductor to form substantially planar magnetic windings.

3. The method according to claim 2, further including folding the planar magnetic windings to form discrete magnetically-coupled windings for capacitor-path inductance cancellation.

4. The method according to claim 2, further including forming the planar magnetic windings by cutting a sheet of conductive material.

5. The method according to claim 2, further including forming the planar magnetic windings by stamping and/or punching a sheet of conductor.

6. The method according to claim 1, further including inserting the windings and the capacitor at least partially in a casing.

7. A filter component fabricated according to the method of claim 1.

8. A method of fabricating an electrical component, comprising:
   forming patterned windings from a conductor to create a coreless transformer having magnetically-coupled windings; and
   coupling the transformer to a discrete capacitor such that magnetic induction of the magnetically-coupled windings provides capacitor-path inductance cancellation,
   wherein induction of the windings generates a voltage that counteracts a voltage due to equivalent series inductance of the capacitor and does not counteract a voltage due to the capacitance of the capacitor.

9. The method according to claim 8, further including folding the patterned windings to create a transformer for capacitor-path inductance cancellation.

10. The method according to claim 9, further including providing electrical insulation between the folded windings.

11. The method according to claim 8, further including establishing geometric spacings between the transformer, the capacitor, and external components.

12. The method according to claim 8, further including providing spacings between the transformer, the capacitor, and external components, wherein the spacings are sized to make the inductance cancellation substantially insensitive to a proximity of external components.

13. The method according to claim 8, further including forming the patterned windings by at least one of punching and stamping a conductor.

14. The method according to claim 8, further including forming the patterned windings by cutting a conductor.

15. The method according to claim 8, further including forming the patterned windings by etching a conductor.

16. The method according to claim 8, further including forming the patterned windings by bending a conductor.

17. The method according to claim 8, further including forming the patterned windings by at least one of molding and casting.

18. A method of suppressing electrical signals, comprising:
   patterning a conductor to create discrete magnetically-coupled windings; and
   electrically coupling the discrete magnetically-coupled windings to a capacitor having first and second terminals such that magnetic induction of the magnetically-coupled windings provides capacitor-path inductance cancellation to suppress the electrical signals,
   wherein induction of the windings generates a voltage that counteracts a voltage due to equivalent series inductance of the capacitor and does not counteract a voltage due to the capacitance of the capacitor.

19. The method according to claim 18, further including inserting the windings and the capacitor in a casing to form a filter element.

20. The method according to claim 19, wherein the filter element has three terminals.

* * * * *

UNITED STATES PATENT AND TRADEMARK OFFICE
CERTIFICATE OF CORRECTION

PATENT NO. : 7,242,269 B2
APPLICATION NO. : 11/119659
DATED : July 10, 2007
INVENTOR(S) : Perreault et al.

It is certified that error appears in the above-identified patent and that said Letters Patent is hereby corrected as shown below:

Col. 3, line 16, delete "a electrical" and replace with --an electrical--.

Col. 3, line 34, delete "is schematic" and replace with -- is a schematic--.

Col. 4, line 39, delete "and a an" and replace with --and an --.

Col. 4, line 42, delete "element; and" and replace with --element--.

Col. 5, line 52, delete "$\Re_1, \Re_2,$" and replace with --$\Re_{11}, \Re_{22},$--.

Col. 6, line 15, delete "$L_M \leq \sqrt{L_{11}L_2}$" and replace with -- $L_M \leq \sqrt{L_{11}L_{22}}$ --.

Col. 6, line 22, delete "coils the" and replace with --coils, the--.

Col. 8, line 29, delete "that the that the" and replace with -- that the--.

Col. 8, line 64, delete "circuit 50" and replace with --circuit 500--.

Col. 9, line 14, delete "driving it a" and replace with --driving a--.

Col. 11, line 31, delete "capacitor alone 800" and replace with --capacitor 800--.

Col. 12, line 5, delete "windings the" and replace with --windings, the--.

Col. 15, line 65, delete "think" and replace with --thick--.

Col. 16, line 1, delete "later." and replace with --layer.--.

UNITED STATES PATENT AND TRADEMARK OFFICE
CERTIFICATE OF CORRECTION

PATENT NO. : 7,242,269 B2
APPLICATION NO. : 11/119659
DATED : July 10, 2007
INVENTOR(S) : Perreault et al.

It is certified that error appears in the above-identified patent and that said Letters Patent is hereby corrected as shown below:

Col. 16, line 41, delete "can be also be" and replace with --can also be--.

Signed and Sealed this

Eighteenth Day of September, 2007

JON W. DUDAS
*Director of the United States Patent and Trademark Office*

UNITED STATES PATENT AND TRADEMARK OFFICE
CERTIFICATE OF CORRECTION

Page 1 of 1

PATENT NO.        : 7,242,269 B2
APPLICATION NO.   : 11/119659
DATED             : July 10, 2007
INVENTOR(S)       : David J. Perreault et al.

It is certified that error appears in the above-identified patent and that said Letters Patent is hereby corrected as shown below:

In column one, lines 15-17 under the "Statement Regarding Federally Sponsored Research" section delete the entire paragraph and replace with --This invention was made with government support under Grant No. N00014-02-1-0481 awarded by the US Navy. The government has certain rights in this invention.--

Signed and Sealed this
Tenth Day of May, 2011

David J. Kappos
*Director of the United States Patent and Trademark Office*